(12) United States Patent
Nagaoka

(10) Patent No.: US 7,944,119 B2
(45) Date of Patent: May 17, 2011

(54) VIBRATORY ACTUATOR AND DRIVE UNIT INCLUDING THE SAME

(75) Inventor: Eiichi Nagaoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/668,470

(22) PCT Filed: Jul. 3, 2008

(86) PCT No.: PCT/JP2008/001758
§ 371 (c)(1), (2), (4) Date: Jan. 11, 2010

(87) PCT Pub. No.: WO2009/008135
PCT Pub. Date: Jan. 15, 2009

(65) Prior Publication Data
US 2010/0176687 A1    Jul. 15, 2010

(30) Foreign Application Priority Data
Jul. 12, 2007   (JP) .................... 2007-182793

(51) Int. Cl.
H01L 41/08 (2006.01)
(52) U.S. Cl. .................... 310/323.02
(58) Field of Classification Search ......... 310/323.02, 310/328
See application file for complete search history.

(56) References Cited

U.S. PATENT DOCUMENTS

| | | | | |
|---|---|---|---|---|
| 6,104,122 A * | 8/2000 | Ishimaru | ............ | 310/323.02 |
| 6,242,846 B1 * | 6/2001 | Ashizawa et al. | ........ | 310/323.02 |
| 6,806,620 B1 * | 10/2004 | Wischnewskiy | ......... | 310/323.02 |
| 7,679,265 B2 * | 3/2010 | Higashionji et al. | ..... | 310/323.02 |
| 7,834,523 B2 * | 11/2010 | Higashionji et al. | ......... | 310/345 |
| 2005/0062367 A1 | 3/2005 | Funakubo et al. | | |
| 2010/0066205 A1 * | 3/2010 | Higashionji et al. | ..... | 310/323.02 |

FOREIGN PATENT DOCUMENTS

| | | |
|---|---|---|
| JP | 62-293977 | 12/1987 |
| JP | 2000-140759 | 5/2000 |
| JP | 2005-094956 | 4/2005 |

OTHER PUBLICATIONS

International Search Report for corresponding Application No. PCT/JP2008/001758 mailed Aug. 12, 2008.
Form PCT/ISA/237.

* cited by examiner

*Primary Examiner* — Mark Budd
(74) *Attorney, Agent, or Firm* — Renner, Otto, Boisselle & Sklar, LLP

(57) ABSTRACT

Damage of a piezoelectric element due to deformation of a piezoelectric element beyond an elastic limit is prevented.

An ultrasonic actuator (2) includes an actuator body (4), a case (5), and a support unit (6). The support unit (6) includes two support rubbers (61) and a connection rubber (63), provided between the case (5) and the actuator body (4), for applying compression force to the actuator body (4) in advance at non-node portions of the vibrations of the actuator body (4) from both sides in the vibration direction of longitudinal vibration. The connection rubber (63) includes center portions (64a), end portions (64b), and reduced-material portions (67) having a lower stiffness than those of the center portions (64a) and the end portions (64b). When the support unit (6) is placed between the case (5) and the actuator body (4), at least the connection rubber (63) is compression-deformed at the reduced-material portions (67).

19 Claims, 22 Drawing Sheets

(a)

(b)

(a)

(b)

VIBRATORY ACTUATOR AND DRIVE UNIT INCLUDING THE SAME

TECHNICAL FIELD

The present invention relates to a vibratory actuator including a piezoelectric element and a drive unit including the vibratory actuator.

BACKGROUND ART

Conventionally, as a vibratory actuator including a piezoelectric element, an actuator disclosed in PATENT DOCUMENT 1 has been known.

The vibratory actuator according to PATENT DOCUMENT 1 includes an actuator body formed of a piezoelectric element, and a driver element attached to the actuator body.

The actuator body is formed of a flat plate-shaped piezoelectric element having a longitudinal direction. In the actuator body, longitudinal vibration (so-called expanding/contracting vibration) along the longitudinal direction of the piezoelectric element and bending vibration (so-called lateral vibration) along a lateral direction of the piezoelectric element are induced in a cooperated manner by respectively applying alternating currents having different phases to two electrode pairs each of which includes two electrodes diagonally arranged. As a result, the driver element makes an orbit motion, more specifically, an elliptical motion in a plane of the piezoelectric element including a longitudinal direction and a lateral direction.

The vibratory actuator configured in the above-described manner is placed between a fixed body and a movable body placed to be movable relatively to the fixed body. Specifically, the vibratory actuator is provided so that the driver elements abut on one (hereinafter referred to as an "abutment body") of the fixed body and the movable body and are fixed to the other one of the fixed body and the movable body. In this state, when the vibratory actuator is operated to cause each of the driver elements to make an orbit motion in the above-described manner, each of the driving elements makes an orbit motion with increased friction force while pressing the abutment body in an area where the orbit motion takes place, and the driver element makes an orbit motion while being spaced apart from the abutment body or with reduced friction force in the other area where the orbit motion does not take place. When each of the driving elements makes an orbit motion while pressing the abutment body, driving force is transmitted to the movable body through friction force between the driver elements and the abutment body to drive the movable body along a predetermined direction.

Reduction in size of the vibratory actuator described in PATENT DOCUMENT 1 is achieved by integrally burning the driver elements with the piezoelectric element.

CITATION LIST

Patent Document

PATENT DOCUMENT 1: Japanese Patent Publication No. 2005-94956

SUMMARY OF THE INVENTION

Technical Problem

However, it is likely that, when the size of the vibratory actuator is reduced as in PATENT DOCUMENT 1, power to be supplied to the vibratory actuator is greatly increased in order to ensure adequate driving power. Thus, when high power is supplied to the vibratory actuator, increased distortion is added to the piezoelectric element. When the distortion is beyond the elastic limit of the piezoelectric element, damage of the piezoelectric element might be caused.

In view of the above-described points, the present invention has been devised, and it is therefore an object of the present invention to prevent damage of a piezoelectric element due to its deformation beyond the elastic limit.

Solution to the Problem

An vibratory actuator according to the present invention includes: an actuator body, including a piezoelectric element, for outputting driving power by generating a plurality of vibrations having different vibration directions; a case for housing the actuator body; and a pressurizing unit including at least two pressurizing members, provided between the case and the actuator body, for applying compression force to the actuator body in advance at non-node portions of vibration of the actuator body from both sides in a vibration direction of the vibration, and a connection member for connecting the at least two pressurizing members with one another. The connection member includes a body portion and a low stiffness portion having a lower stiffness than that of the body portion, the pressurizing unit has larger outer dimensions than corresponding inner dimensions of the case, and at least the connection member is compression-deformed at the low stiffness portion when the pressurizing unit is provided between the case and the actuator body.

In the above-described configuration, by applying compression force to the actuator body in advance at non-node portions of the actuator body by the at least two pressurizing members, tensile stress generated in the piezoelectric element when the vibratory actuator is operated can be reduced, and thus, the piezoelectric element is hardly damaged.

Also, the plurality of pressurizing members are connected as one unit by the connection member, and thereby, assembly property and accuracy in positioning when the pressurizing members are placed between the case and the actuator body can be improved. The pressurizing unit connected as one unit in this manner has larger outer dimensions than corresponding inner dimensions of the case when being in a normal state, and is compression-deformed when being placed between the case and the actuator body.

In the configuration in which the plurality of the pressurizing members are connected via the connection member to form a pressurizing unit and the pressurizing unit in a compression-deformed state is placed between the case and the actuator body, the pressurizing member might receive unnecessary external force from the connection member when the pressurizing unit in a compression-deformed state is placed between the case and the actuator body. Accordingly, the position of the pressurizing member might be shifted from a desired position, or desired compression force might not be able to be applied to the actuator body. That is, when the pressurizing unit is compression-deformed, consequently, the connection member might be deformed and, due to stress of the deformed connection member, external force might act on the pressurizing member.

Therefore, according to the present invention, the low stiffness portion is provided to the connection member so that the connection member is compression-deformed at the low stiffness portion when the pressurizing unit is compression-deformed. Thus, compression stress generated in the connection member is reduced, so that unnecessary external force from the connection member, which acts on the pressurizing member can be reduced.

A drive unit according to the present invention includes: a fixed body and a movable body capable of relative displacement; and the above-described vibratory actuator provided between the fixed body and the movable body. The vibratory actuator is placed so that the actuator body is pressed to the movable body, and compression force applied by the pressurizing members is larger than pressing force to press the actuator body to the movable body.

Advantages of the Invention

According to the present invention, compression force is applied to the actuator body in advance by at least two pressurizing members at non-node portions of vibration of the actuator body in a vibration direction of the vibration. Thus, a vibratory actuator in which a piezoelectric element is hardly damaged can be provided. Moreover, by forming the plurality of pressurizing members as one unit via the connection member, the assembly property of the vibratory actuator can be improved and the accuracy in positioning of the pressurizing members can be improved. In addition, with the low stiffness portion provided to the connection member, when a pressurizing unit is placed between the case and the actuator body, the connection member is compression-deformed at least at the low stiffness portion, and thereby, application of unnecessary external force to the pressurizing members from the connection member can be prevented. Accordingly, a desired level of compression force can be applied to the actuator body at a desired position from the pressurizing members.

BRIEF DESCRIPTION OF THE DRAWINGS

FIG. 9(*a*) shows the support unit in a normal state.
FIG. 9(*b*) shows the support unit in a compression-deformed state.
FIG. 12(*a*) shows a state before the stage is driven.
FIG. 12(*b*) shows a state where the actuator body expands in the longitudinal direction and thereby one of driver elements drives a stage.
FIG. 12(*c*) shows a state where the actuator body contracts in the longitudinal direction and thereby the other one of the driver elements drives the stage.

FIG. 15(*a*) shows the support unit in a normal state.
FIG. 15(*b*) shows the support unit in a compression-deformed state.

Figure 1:
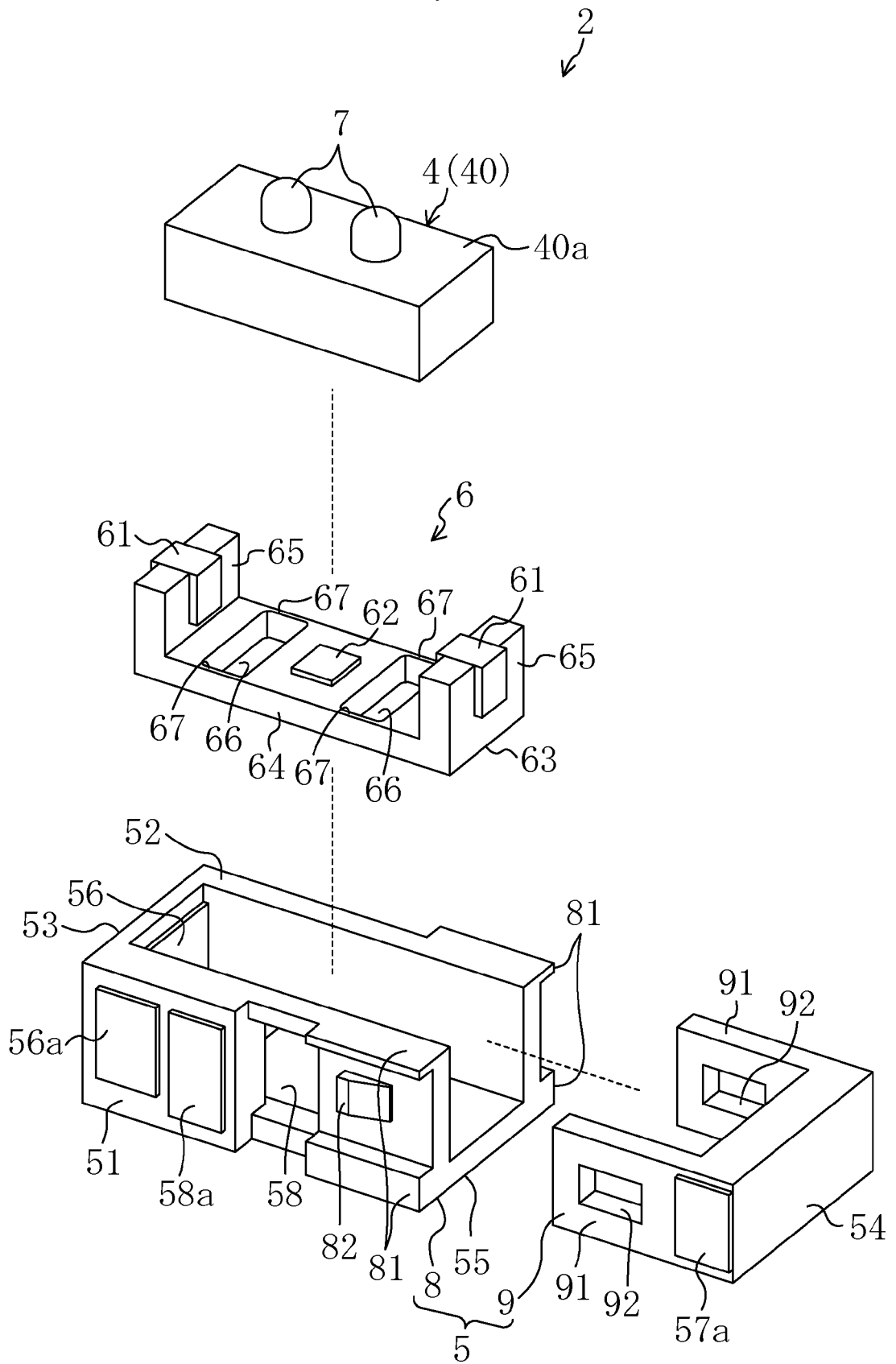
FIG. 1 is an exploded perspective view of an ultrasonic actuator according to Embodiment 1 of the present invention.

DESCRIPTION OF REFERENCE CHARACTERS 1, 601, 701, 801 Drive unit
11 Stage (movable body)
2, 202, 302, 402, 502 Ultrasonic actuator (vibratory actuator)
4, 404 Actuator body
46, 47, 48 External electrode (body side power supply electrode)
5, 205, 305, 505 Case
8, 208, 308 First case
9, 209, 309 Second case
56, 57, 58 Electrode (case side power supply electrode)
6, 206, 306, 406 Support unit (pressurizing unit)
61 Support rubber (pressurizing member)
62 Support rubber (pressurizing member)
63, 263, 363, 463, 563 Connection rubber (connection member)
64*a*, 264*a*, 364*a*, 464*a* Center portion (body portion)
64*b*, 264*b*, 364*b*, 464*b* End portion (body portion)
67, 267, 367, 467 Reduced-material portion (low stiffness portion)
53*a*, 54*a* Pressing portion
268, 368 Pressed portion
69 Precompression rubber (pressurizing member)
79 Dummy member (balance weight)

DESCRIPTION OF EMBODIMENTS

Embodiments of the present invention will be described hereinafter in detail with reference to the accompanying drawings.

Embodiment 1

Figure 3:
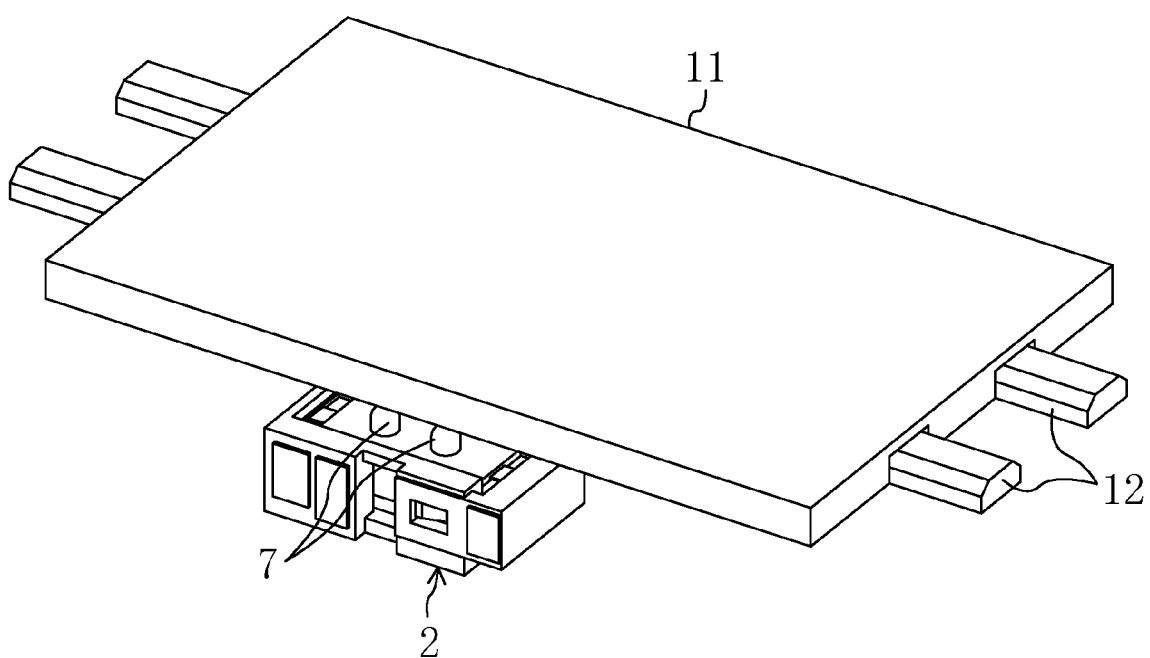
FIG. 3 is a perspective view of a drive unit.

As shown in FIG. 3, a drive unit 1 according to Embodiment 1 of the present invention includes a stage 11, an ultrasonic actuator 2, and a control unit (not shown) for performing drive control of the ultrasonic actuator 2.

The stage 11 is attached to guides 12, fixed on a base (not shown) as a fixed body in parallel to one another, so as to be capable of sliding. That is, the stage 11 is configured so as to be movable along a direction in which the guides 12 extend. The stage 11 forms a movable body. The direction in which the guides 12 extend is a moving direction of the stage 11. The stage 11 is a flat plate member having an approximately square shape when viewed from the top, and is formed of alumina. The material of the stage 11 is not limited to alumina, but the stage 11 may be formed of any material. The ultrasonic actuator 2 is placed so that driver elements 7, which will be described later, abut on a back surface of the stage 11 (on which the guides 12 are provided).

Figure 2:
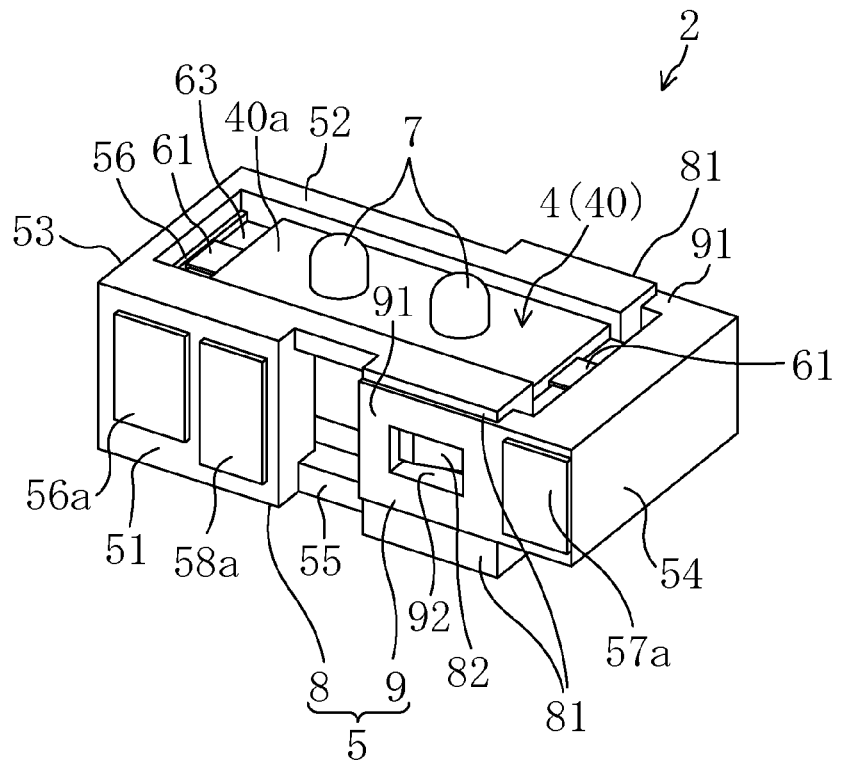
FIG. 2 is a perspective view of an ultrasonic actuator.

As shown in FIGS. 1 and 2, the ultrasonic actuator 2 includes an actuator body 4 for generating vibration, driver elements 7 for transmitting driving force of the actuator body 4 to the stage 11, a case 5 for housing the actuator body 4, and a support unit 6 including support rubbers 61, provided between the actuator body 4 and the case 5, for elastically supporting the actuator body 4 and a bias rubber 62 for biasing the actuator body 4 to the stage 11. The ultrasonic actuator 2 forms a vibratory actuator (the same applies to each embodiment described below).

The actuator body 4 is formed of a piezoelectric element unit 40.

The piezoelectric element unit 40 has an approximately rectangular parallelepiped shape including a pair of principal surfaces each having an approximately rectangular shape and being opposed to one another, a pair of long side surfaces each being perpendicular to each of the principal surfaces, extending along longitudinal directions of the principal surfaces and being opposed to one another, and a pair of short side surfaces each being perpendicular to each of the principal surfaces and the long side surfaces, extending along lateral directions of the principal surfaces and being opposed to one another.

Figure 4:
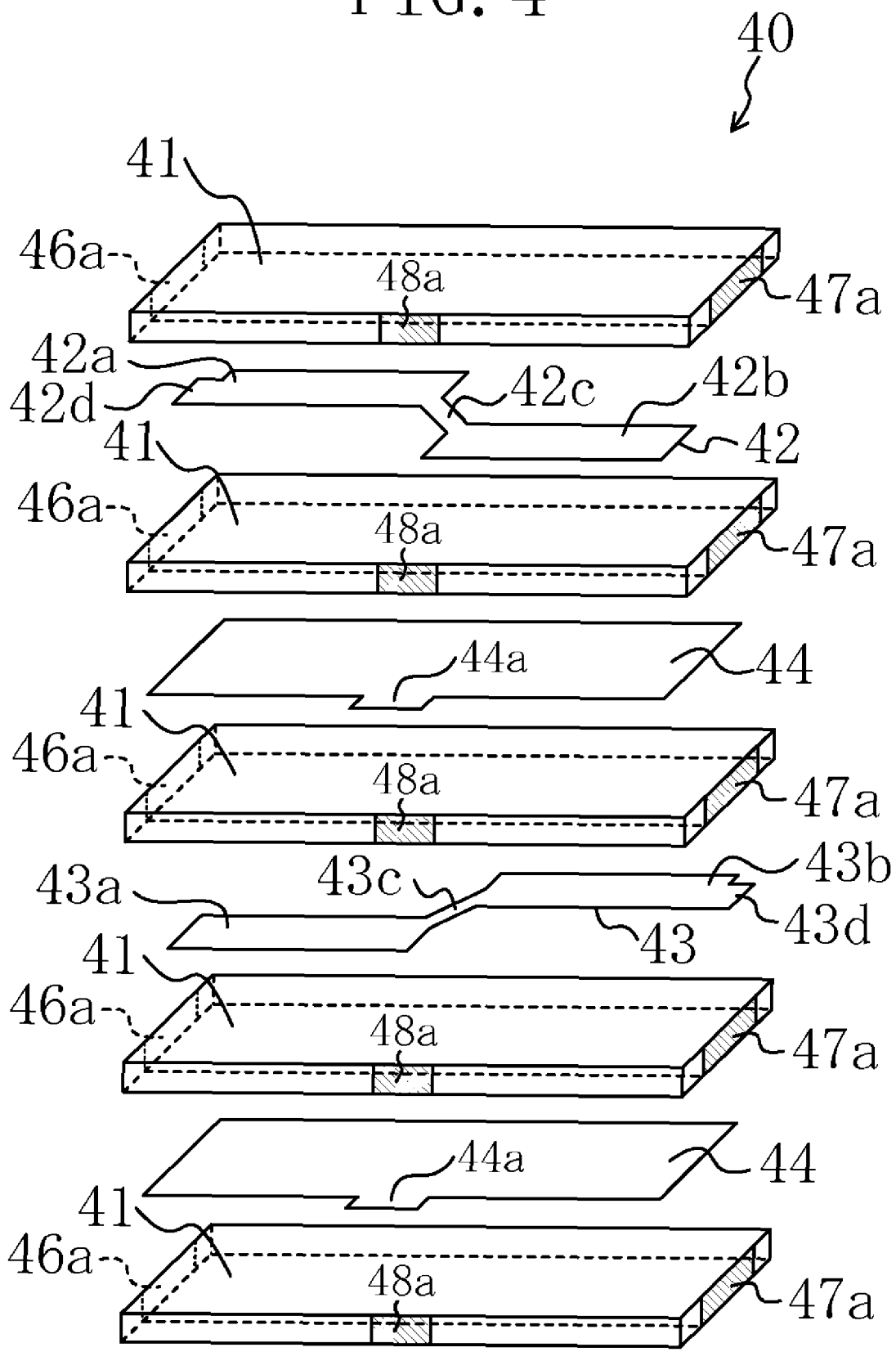
FIG. 4 is an exploded perspective view of a piezoelectric element unit.

As shown in FIG. 4, the piezoelectric element unit 40 includes five piezoelectric element layers (piezoelectric elements) 41 and four internal electrode layers 42, 44, 43 and 44, which are alternately stacked. Specifically, the internal electrode layers 42, 44, 43 and 44 are, respectively, formed of a first power supply electrode layer 42, a common electrode layer 44, a second power supply electrode layer 43 and another common electrode layer 44 which are alternately provided in a stacking direction with each of the piezoelectric element layers 41 interposed between any two of the internal electrode layers. Each of the first power supply electrode layer 42, the second power supply electrode layer 43 and the common electrode layers 44 is printed on an associated one of the piezoelectric element layers 41.

Each of the piezoelectric element layers 41 is an insulating layer, for example, formed of a ceramic material such as lead zirconate titanate and has an approximately rectangular parallelepiped shape including a pair of principal surfaces, a pair of long side surfaces and a pair of short side surfaces in the same manner as the piezoelectric element unit 40. Moreover, in each of the piezoelectric element layers 41, an external electrode 48a is formed in a center portion of one of the long side surfaces in the longitudinal direction, an external electrode 46a is formed in a center portion of one of the short side surfaces in the lateral direction, and an external electrode 47a is formed in a center portion of the other one of the short side surfaces in the lateral direction.

Each of the common electrode layers 44 has an approximately rectangular shape provided on an approximately entire principal surface of an associated one of the piezoelectric element layers 41. Moreover, a lead electrode 44a is formed in one of long side portions of each of the common electrode layers 44 so as to extend from a center portion of the common electrode layer 44 in the longitudinal direction thereof to the external electrode 48a of the piezoelectric element layer 41.

Figure 5:
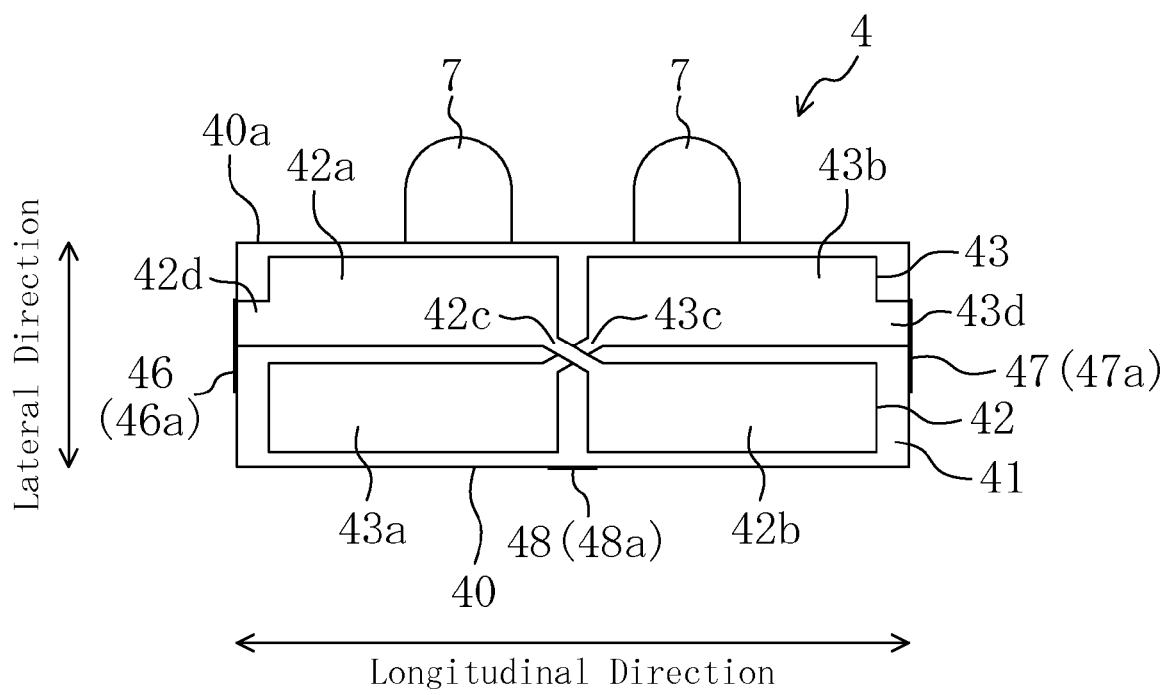
FIG. 5 is a schematic front view illustrating a configuration of an actuator body.

Suppose that the principle surface of each of the piezoelectric element layers 41 is divided in four areas, i.e., two areas in the longitudinal direction and two areas in the lateral direction. As shown in FIG. 5, the first power supply electrode layer 42 includes first electrodes 42a and 42b respectively formed in one pair of the areas located in one diagonal direction of the principal surface, and a conductive electrode 42c for connecting the first electrodes 42a and 42b to bring them in conduction. Each first electrode 42a (42b) is an electrode having an approximately rectangular shape and overlaps with the common electrode layers 44 when viewed in the stacking direction. That is, each first electrode 42a (42b) is opposed to an associated one of the common electrode layers 44 with an associated one of the piezoelectric element layers 41 interposed therebetween. One of the first electrodes 42a and 42b, i.e., the first electrode 42a is provided with a lead electrode 42d extending to the external electrode 46a of the piezoelectric element layer 41.

The second power supply electrode layer 43 includes a pair of second electrodes 43a and 43b respectively formed in the other pair of the areas located in the other diagonal direction of the principal surface, and a conductive electrode 43c for connecting the second electrodes 43a and 43b to bring them in conduction. When viewed in the stacking direction, the second electrode 43a is provided in one area of the other pair, which is located adjacent to the first electrode 42a in the lateral direction and adjacent to the first electrode 42b in the longitudinal direction, and the second electrode 43b is provided in the other area of the same pair, which is located adjacent to the first electrode 42a in the longitudinal direction and adjacent to the first electrode 42b in the lateral direction. Each second electrode 43a (43b) is an electrode having an approximately rectangular shape and overlaps with the common electrode layers 44, when viewed in the stacking direction. That is, each second electrode 43a (43b) is opposed to an associated one of the common electrode layers 44 with an associated one of the piezoelectric element layers 41 interposed therebetween. Moreover, one of the second electrodes 43a and 43b, i.e., the second electrode 43b is provided with a lead electrode 43d extending to the external electrode 47a of the piezoelectric element layer 41.

In the piezoelectric element unit 40 formed by alternately stacking the piezoelectric element layers 41 and the internal electrode layers 42, 44, 43 and 44, the respective external electrodes 48a of the piezoelectric element layers 41 align in the stacking direction in a center portion of one long side surface thereof in the longitudinal direction, thereby forming an integrated external electrode 48. The lead electrodes 44a provided to the common electrode layers 44 are electrically connected to the integrated external electrode 48. In the same manner, the respective external electrodes 46a of the piezoelectric element layers 41 align in the stacking direction in a center portion of one short side surface of the piezoelectric element unit 40 in the lateral direction, thereby forming an integrated external electrode 46. The lead electrode 42*d* of the first power supply electrode layer 42 is electrically connected to the integrated external electrode 46. Furthermore, the respective external electrode 47*a* of the piezoelectric element layers 41 align in the stacking direction in a center portion of the other short side surface of the piezoelectric element unit 40 in the lateral direction, thereby forming an integrated external electrode 47. The lead electrode 43*d* of the second power supply electrode layer 43 is electrically connected to the integrated external electrode 47. The external electrodes 46, 47 and 48 form body side power supply electrodes.

On the other long side surface (specifically, one of the pair of surfaces facing in a vibration direction of bending vibration which will be described later and will be hereinafter also referred to as a "setting surface") of the piezoelectric element unit 40 in which the external electrodes 48*a* are not provided, two driver elements 7 are provided.

The driver elements 7 are members each having a circular column shape with a hemispherical shaped end portion, and are formed of zirconia, alumina, silicon nitride, silicon carbide, tungsten carbide, or the like. The driver elements 7 are attached to the setting surface 40*a* by an adhesive bond so as to be in line contact with the setting surface 40*a*. The adhesive bond is preferably formed of a softer material than respective materials of the piezoelectric element unit 40 and the driver elements 7. Specifically, examples materials include synthetic resin, particularly, epoxy resin and silicone resin. The use of such materials allows the driver elements 7 to be reliably fixed with the setting surface 40*a* while minimizing damping of vibration of the piezoelectric element unit 40, which will be described later.

Moreover, the driver elements 7 are provided in parts of the setting surface 40*a* located at a distance of 30% to 35% of the full length of the setting surface 40*a* inwardly from both of end portions of the piezoelectric element unit 40 in the longitudinal direction, respectively. That is, each of the locations of the driver elements 7 corresponds to an antinode of a second-order mode of bending vibration of the piezoelectric element unit 40 where vibration is maximum, which will be described later.

In the actuator body 4 configured in the above-described manner, the external electrode 48 is connected to the ground, alternating voltages having a predetermined frequency and different phases from one another by 90° are applied to the external electrodes 46 and 47. Thus, alternating voltages which have different phases from one another by 90° are applied to the one pair of the first electrodes 42*a* and 42*b* and the other pair of the second electrode 43*a* and 43*b*, respectively, each of which is located in an associated one of the diagonal directions of the principal surface of each piezoelectric element layer 41, so that longitudinal vibration (i.e., so-called expanding/contracting vibration) along the longitudinal direction of the actuator body 4 and bending vibration (i.e., so-called lateral vibration) along the lateral direction of the actuator body 4 are induced.

Figure 6:
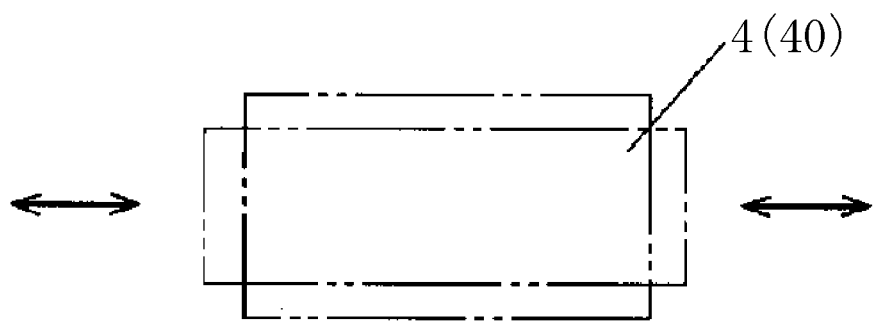
FIG. 6 is a conceptual diagram illustrating displacement made by a first-order mode of longitudinal vibration of an actuator body along a longitudinal direction.
Figure 7:
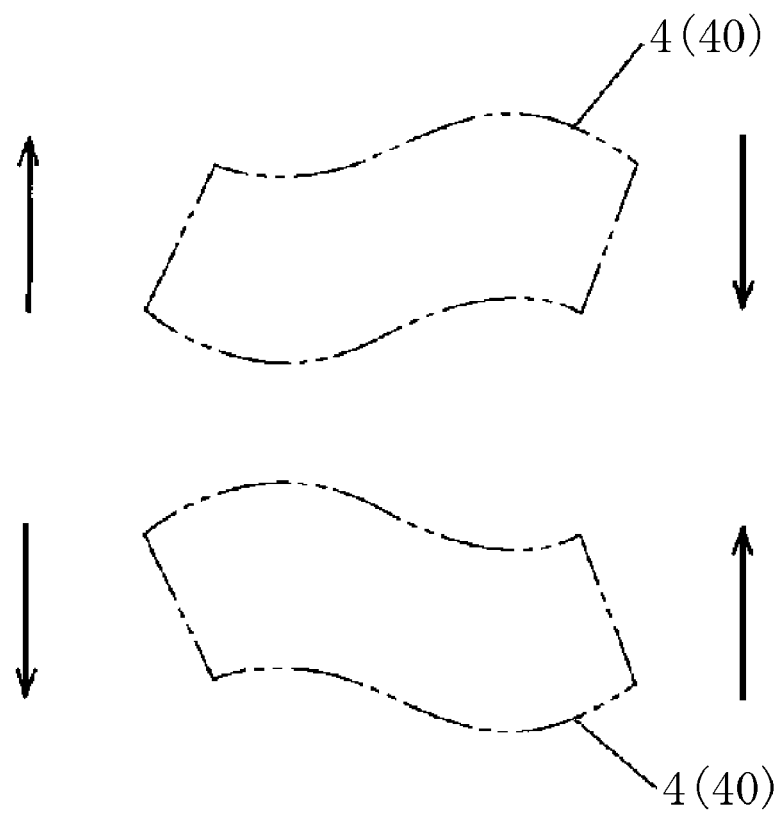
FIG. 7 is a conceptual diagram illustrating displacement made by a second-order mode of bending vibration of the actuator body.
Figure 8:
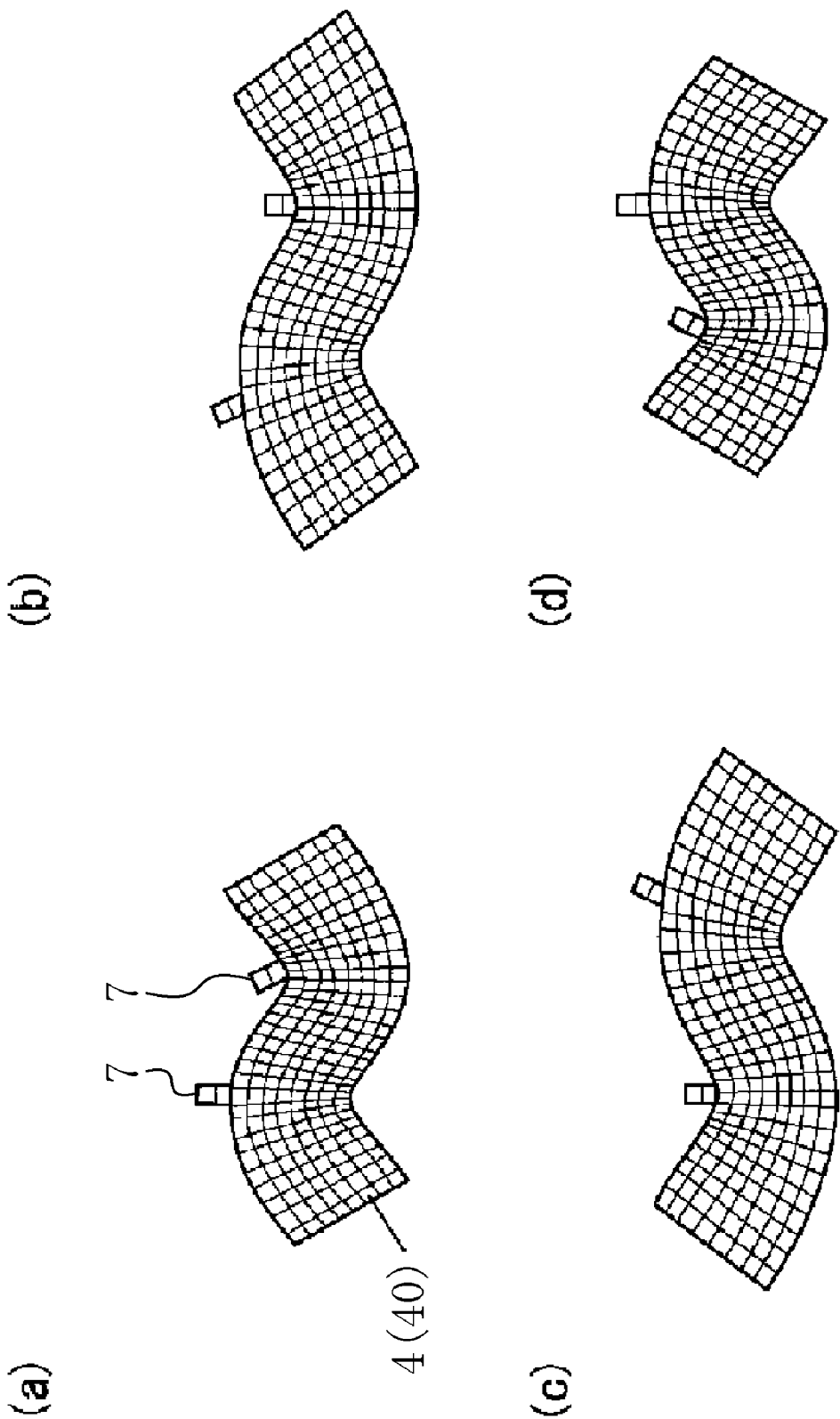
FIGS. 8(*a*)-8(*d*) are conceptual diagrams illustrating the operation of the actuator body.

Respective resonance frequencies of longitudinal vibration and bending vibration are determined by a material, a shape and the like of the actuator body 4, i.e., the piezoelectric element unit 40. Furthermore, both of the resonance frequencies are influenced by force supporting the actuator body 4 and a position where the actuator body 4 is supported. Considering this, the resonance frequencies are substantially matched to one another, and alternating voltages having a frequency around the resonance frequencies and different phases from one another by 90° are applied to the external electrodes 46 and 47, respectively. For example, with the piezoelectric element unit 40 designed to have a shape or the like which allows the respective resonance frequencies of a first-order mode of longitudinal vibration (see FIG. 6) and a second-order mode of bending vibration (see FIG. 7) to be matched to one another, alternating voltages having a frequency around the resonance frequencies and phases shifted from one another by 90° are applied. Thus, the first-order mode of longitudinal vibration and the second-order mode of bending vibration are harmonically induced in the piezoelectric element unit 40, so that the piezoelectric element unit 40 changes itself into shapes shown in FIGS. 8(*a*), 8(*b*), 8(*c*) and 8(*d*) in this order.

As a result, each of the driver elements 7 provided to the piezoelectric element unit 40 makes an approximately elliptical motion, i.e., an orbit motion in a plane parallel to a principal surface of the piezoelectric element unit 40 (i.e., a plane parallel to the drawing sheet of FIG. 8), i.e., a plane including a longitudinal direction and a lateral direction (in other words, a plane including a vibration direction of longitudinal vibration and a vibration direction of bending vibration).

The piezoelectric element unit 40 configured in the above-described manner has a plurality of antinodes of vibration. The term "antinode of vibration" used herein means a position where deformation of vibration is local maximum. In the piezoelectric element unit 40 in which the first-order mode of longitudinal vibration and the second-order mode of bending vibration are induced in a cooperated manner, there are two antinodes of longitudinal vibration located respectively at both of the short side surfaces of the piezoelectric element unit 40, eight antinodes of lateral vibration, i.e., four antinodes located at both of end portions of one of the long side surfaces of the piezoelectric element unit 40 and both of end portions of the other one of the long side surfaces thereof, and four antinodes located at parts at a distance of 30% to 40% of the full length of the piezoelectric element unit 40 inwardly from both ends of one of the long side surfaces and the other one of the long side surfaces in the longitudinal direction of the piezoelectric element unit 40. That is, the piezoelectric element unit 40 has ten antinodes of vibration including antinodes of expanding/contracting vibration and antinodes of bending vibration. The driver elements 7 are provided so as to correspond to antinodes at parts of the setting surface 40*a* which is one of the long side surfaces, located at a distance of 30% to 35% of the full length of the long side surface inwardly from both ends of the long side surface.

The case 5 has an approximately rectangular parallelepiped box shape corresponding to the piezoelectric element unit 40. The case 5 includes a pair of principal wall portions 51 and 52 each of which is parallel to the principal surface of the piezoelectric element unit 40 and has an approximately rectangular shape, a first short side wall portion 53 provided between respective short side portions of the principal wall portions 51 and 52 each being located at one side (the left side of FIG. 1) of an associated one of the principal wall portions 51 and 52 in the longitudinal direction, a second short side wall portion 54 provided between respective short side portions of the principal wall portions 51 and 52 each being located at the other side (the right side of FIG. 1) of an associated one of the principal wall portions 51 and 52 in the longitudinal direction, and a long side wall portion 55 provided between respective long side portions of the principal wall portions 51 and 52 each being located at one side (the lower side of FIG. 1) of an associated one of the principal wall portions 51 and 52 in the lateral direction. That is, in the case 5, no wall portion is provided between respective long side portions of the principal wall portions 51 and 52 each being located at the other side (the upper side of FIG. 1) of an associated one of the principal wall portions 51 and 52 in the lateral direction (or in a part corresponding to the long side surface of the piezoelectric element unit 40 on which the driver elements 7 are provided). That is, the case 5 is open at the above-described other end side in the lateral direction. The case 5 has a separate configuration including two separated portions, i.e., a first case 8 and a second case 9.

The first case 8 has an approximately box shape in which the principal wall portions 51 and 52, the first short side wall portion 53 and the long side wall portion 55 are provided so as to be connected to one another, and is open at the other side in the longitudinal direction and the other side in the lateral direction.

The second case 9 is configured to include the second short side wall portion 54. The second case 9 includes engaging arms 91 which extend respectively from both ends of the second short side wall portion 54 in the thickness direction of the actuator body 4 so that the principal wall portions 51 and 52 of the first case 8 are sandwiched therebetween.

More specifically, guide portions 81 for guiding each of the engaging arms 91 of the second case 9 are provided on an outer surface of each of the principal wall portions 51 and 52 of the first case 8, and an engaging projection 82 is provided between the guide portions 81.

A catch hole 92 for catching the engaging projection 82 of the first case 8 is formed in each of the engaging arms 91 of the second case 9.

Figure 10:
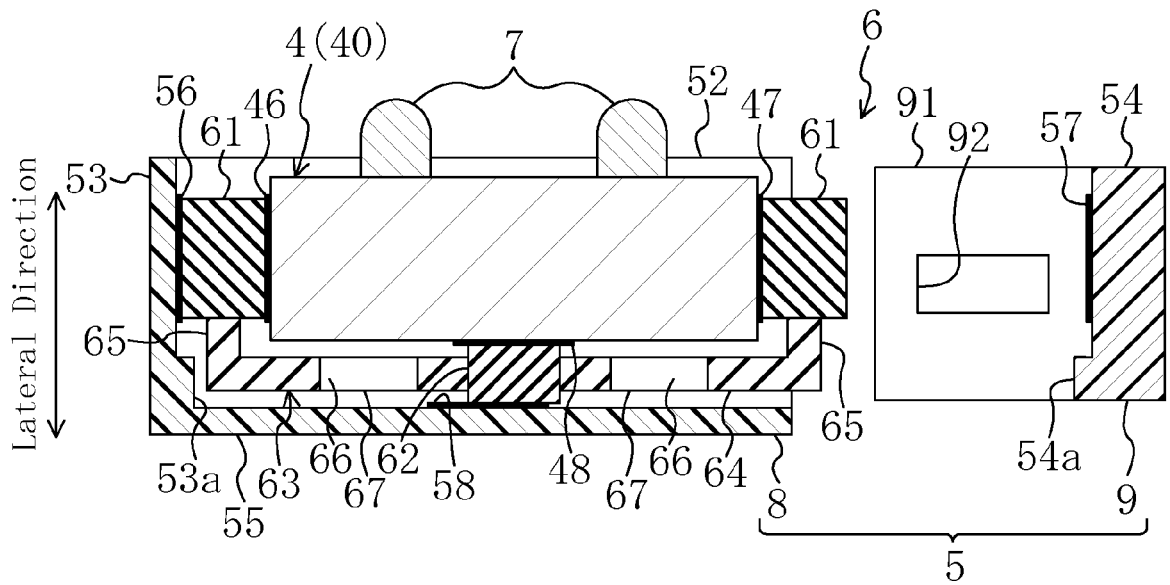
FIG. 10 is a cross-sectional view of an ultrasonic actuator before assembly.
Figure 11:
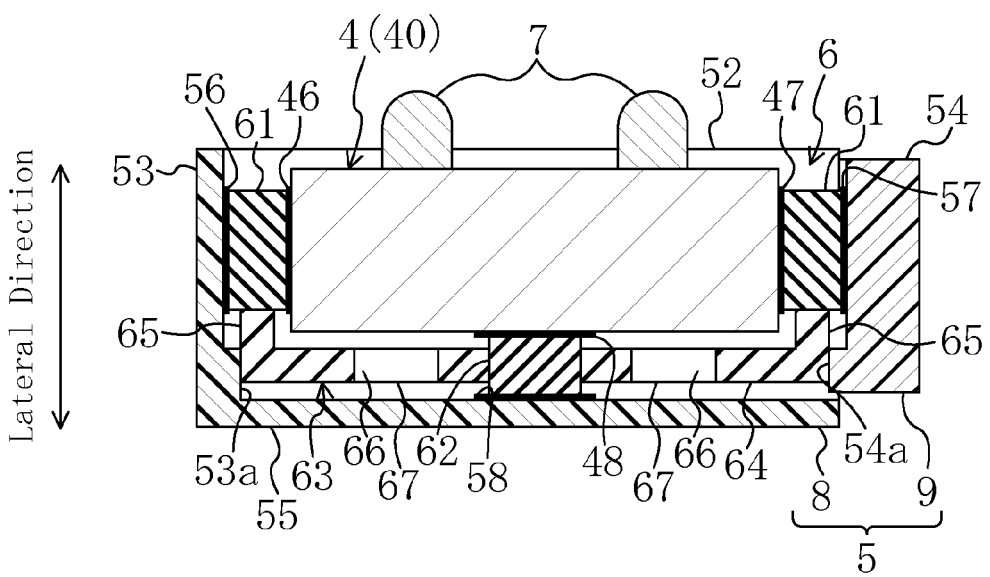
FIG. 11 is a cross-sectional view of the ultrasonic actuator after assembly.

Furthermore, as shown in FIGS. 10 and 11, in one of end portions of an inner surface of the first short side wall portion 53 of the first case 8 in the lateral direction, a pressing portion 53a is provided in a part facing a connection rubber 63 of the support unit 6, which will be described later, so as to project inwardly in the longitudinal direction. Similarly, in one of end portions of an inner surface of the second short side wall portion 54 of the second case 9 in the lateral direction, a pressing portion 54a is provided in part facing a connection rubber 63, which will be described later, so as to project inwardly in the longitudinal direction.

The first and second cases 8 and 9 are formed of resin, and electrodes 56, 57 and 58 (see FIGS. 10 and 11) are insert-molded in the first and second cases 8 and 9. The electrodes 56, 57 and 58 are provided respectively in parts of the first case 8 and the second case 9 facing the external electrodes 46, 47 and 48 of the actuator body 4 housed in the case 5. Specifically, on the inner surface of the first short side wall portion 53 of the first case 8, the electrode 56 is provided in a part facing the external electrode 46 of the actuator body 4. On the inner surface of the long side wall portion 55 of the first case 8, the electrode 58 is provided in a part facing the external electrode 48 of the actuator body 4. On the inner surface of the second short side wall portion 54 of the second case 9, the electrode 57 is provided in a part facing the external electrode 47 of the actuator body 4. The electrodes 56 and 58 are electrically connected respectively to terminal electrodes 56a and 58a provided on an outer surface of the principal wall portion 51 of the first case 8, and the electrode 57 is electrically connected to a terminal electrode 57a provided on an outer surface of one of the engaging arms 91 of the second case 9. As described above, the configuration in which the electrodes 56, 57 and 58 and the terminal electrodes 56a, 57a and 58a are provided to the first case 8 and the second case 9 can be obtained not only by insert-molding but also by using an MID (Mold Interconnection Device) and, besides the above-described configuration, any given configuration can be employed. The electrodes 56, 57 and electrode 58 form case side power supply electrodes.

The support unit 6 includes the support rubbers 61, the bias rubber 62, and the connection rubber 63 for connecting the support rubbers 61 and the bias rubber 62, and has an approximately square U-shape. The support unit 6 forms a pressurizing unit.

Each of the support rubbers 61 is formed of conductive rubber including an insulating layer formed of rubber and a conductive layer obtained by mixing metal powder (for example, silver powder) into rubber which are alternately stacked, and has an approximately rectangular parallelepiped shape. The support rubbers 61 elastically support the actuator body 4 in the longitudinal direction of the actuator body 4 (this is, the longitudinal direction corresponds to a support direction), and give compression force to the actuator body 4 in the longitudinal direction. The conductive rubber preferably has a coefficient of elasticity equal to or smaller than $\frac{1}{100}$ of that of the actuator body 4. Thus, vibration of the actuator body 4 is not damped, and therefore, it is possible to provide a highly efficient ultrasonic actuator 2. The support rubbers 61 form pressurizing members.

Similarly to the support rubbers 61, the bias rubber 62 is formed of conductive rubber including an insulating layer formed of rubber and a conductive layer obtained by mixing metal powder (for example, silver powder) into rubber which are alternately stacked, and has an approximately rectangular parallelepiped shape. The bias rubber 62 biases the actuator body 4 against the stage 11.

The support rubbers 61 and the bias rubber 62 may be formed of conductive rubber having a single layer structure formed of only silicone rubber with metal powder mixed therein, instead of conductive rubber having the above-described stacked structure.

Figure 9:
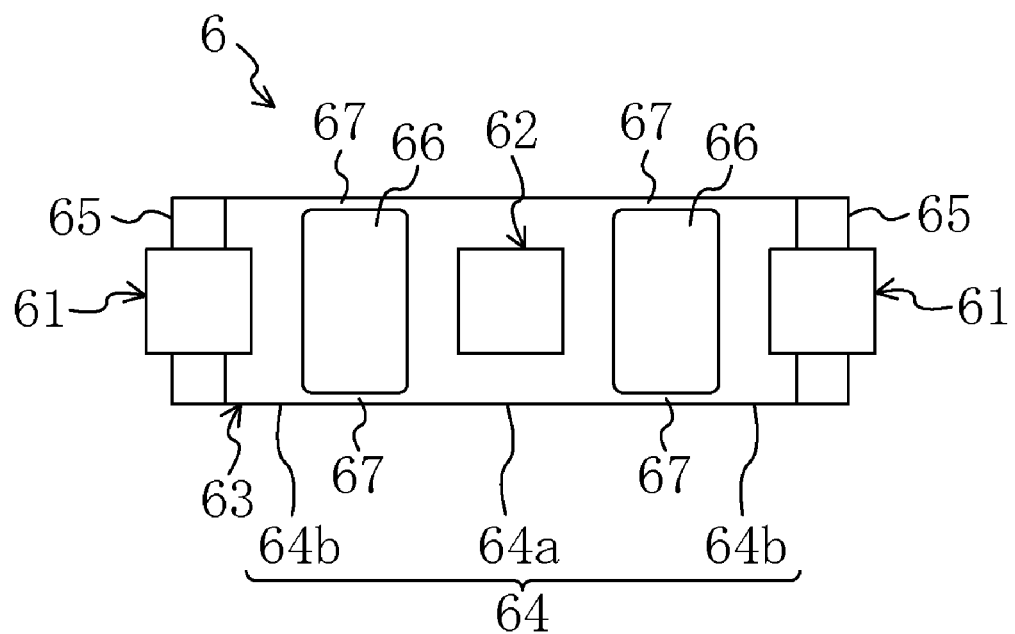
FIGS. 9(*a*) and 9(*b*) are plan views illustrating a support unit.
Figure 9:
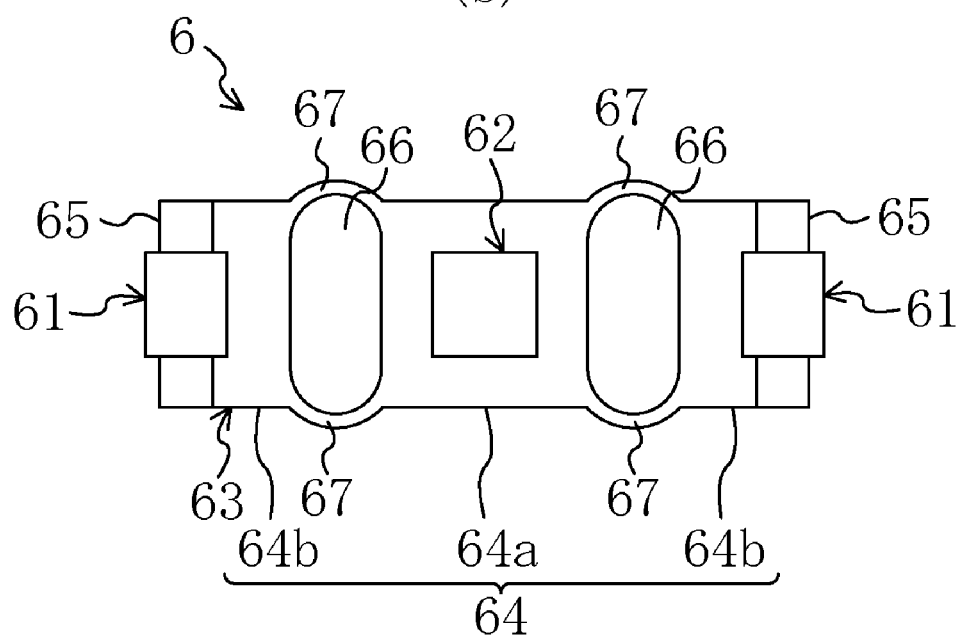

The connection rubber 63 is formed of insulating rubber having a lower hardness than that of the support rubbers 61 and the bias rubber 62. Specifically, silicone rubber having a small creep in a high temperature environment is preferably used. As shown in FIG. 1 and FIGS. 9(*a*) and 9(*b*), the connection rubber 63 includes a long side portion 64, and short side portions 65 extending upright respectively from end portions of the long side portion 64 in the longitudinal direction, and has an approximately square U-shape. The connection rubber 63 forms a connection member.

The long side portion 64 includes a center portion 64a located in a center thereof in the longitudinal direction, end portions 64b located at both sides of the center portion 64a in the longitudinal direction, and thin-walled portions 67 for connecting the center portion 64a with both of the end portions 64b.

In the center portion 64a, a through hole is formed, and the bias rubber 62 is inserted in the through hole. That is, the bias rubber 62 is surrounded by the center portion 64a, and thus, when the bias rubber 62 is compression-deformed in a penetrating direction of the through hole (in the lateral direction of the actuator body 4 when being installed as the ultrasonic actuator 2), deformation in which the bias rubber 62 expands in an orthogonal direction to the penetrating direction is reduced by the center portion 64a. Thus, plastic deformation of the bias rubber 62 due to creep deformation in a high temperature environment can be prevented, so that force biasing the actuator body 4 to the stage 11 side can be maintained constant.

The short side portions 65 are provided respectively at both of the end portions 64b. A notch portion is formed in an end portion of the each of the short side portions 65, and the support rubbers 61 are inserted respectively in the notch portions so that each of the support rubbers 61 passes through an associated one of the short side portions 65. That is, each of the support rubbers 61 is surrounded on three sides by the short side portions 65, and thus, when the support rubbers 61 are compression-deformed in a penetrating direction of the support rubbers 61 (in the longitudinal direction of the actuator body 4 when being installed as the ultrasonic actuator 2), deformation in which the support rubbers 61 expand in an orthogonal direction to the penetrating direction is reduced by the short side portions 65. Thus, plastic deformation of the support rubbers 61 due to creep deformation in a high temperature environment can be prevented, so that supporting force supporting the actuator body 4 in the longitudinal direction and compression force applied to the actuator body 4 in the longitudinal direction can be maintained constant. Similarly to the bias rubber 62, the support rubbers 61 may be configured so that a through hole is formed in each of the short side portions 65 and the support rubbers 61 are inserted respectively in the through holes.

Each of the thin-walled portions 67 has a smaller cross-sectional area (specifically, area of a cross section which is perpendicular to the longitudinal direction) than, and a smaller stiffness than that of each of other parts in the long side portion 64, i.e., the center portion 64a and both of the end portions 64b. Moreover, a cross section of each of the thin-walled portions 67 has a rectangular shape with a smaller dimension in the lateral direction of the long side portion 64 (i.e., the thickness direction of the actuator body 4) than a dimension in the thickness direction of the long side portion 64 (i.e., a lateral direction of the actuator body 4). The thin-walled portions 67 forms low stiffness portions, and the center portion 64a and both of the end portions 64b form body portions.

In the above-described manner, the long side portion 64 is configured so that the center portion 64a is connected to both of the end portions 64b by the thin-walled portions 67. In other words, reduced-material portions 66, which are through holes, are formed in parts of the long side portion 64 each being located outward of the bias rubber 62 in the longitudinal direction. Each of the reduced-material portions 66 is an approximately rectangular hole and penetrates through the long side portion 64.

The support unit 6 is housed in the case 5, and the actuator body 4 is placed in the support unit 6 housed in the case 5. In this case, the bias rubber 62 is located between the external electrode 48 of the actuator body 4 and the electrode 58 of the case 5, one of the support rubbers 61 is located between the external electrode 46 of the actuator body 4 and the electrode 56 of the case 5, and the other one of the support rubbers 61 is located between the external electrode 47 of the actuator body 4 and the electrode 57 of the case 5.

A distance between the support rubbers 61 in the longitudinal direction of the actuator body 4 (specifically, a distance between respective surfaces of the support rubbers 61 each facing inward) is approximately equal to or slightly larger than the length of the actuator body 4 in the longitudinal direction.

Moreover, an outer dimension of the support unit 6 in the longitudinal direction, i.e., a width between an surface of one of the support rubbers 61 facing outward and a surface of the other one of the support rubbers 61 facing outward in the longitudinal direction is larger than an inner dimension of the case 5 in the longitudinal direction, i.e., a width between an inner surface of the first short side wall portion 53 and an inner surface of the second short side wall portion 54 in the longitudinal direction. That is, the support unit 6 is compression-deformed in the longitudinal direction and is housed in the case 5.

Furthermore, a dimension of each of the support rubbers 61 in the longitudinal direction is larger than a dimension of a space between the actuator body 4 and the case 5 in the longitudinal direction, which is provided at each of the end portions of the actuator body 4 in the longitudinal direction when the actuator body 4 is housed in the case 5. That is, each of the support rubbers 61 is compression-deformed and is placed between the actuator body 4 and the case 5.

Each of the support rubbers 61 and the bias rubber 62 projects inwardly and outwardly from the inner and outer surfaces of the square U-shape of the connection rubbers 63, i.e., toward the actuator body 4 and the case 5 when the actuator body 4 and the case 5 are incorporated into the ultrasonic actuator 2.

Next, the assembly of the ultrasonic actuator 2 will be described.

First, the actuator body 4 and the support unit 6 are housed in the first case 8. As shown in FIG. 10, in this case, the support unit 6 is housed in the first case 8 so that one of the support rubbers 61 of the support unit 6 abuts on the electrode 56 of the first short side wall portion 53 of the first case 8 and the bias rubber 62 of the support unit 6 abuts on the electrode 58 of the long side wall portion 55 of the first case 8. The actuator body 4 is set in the support unit 6 so that the external electrode 48 of the actuator body 4 abuts on the bias rubber 62 of the support unit 6 and the external electrode 46 of the actuator body 4 abuts on or is closely located to one of the support rubbers 61 of the support unit 6, and the external electrode 47 of the actuator body 4 abuts on or is closely located to the other one of the support rubbers 61 of the support unit 6.

In this case, the other one of the support rubbers 61 of the support unit 6 has a part projecting outwardly from an opening portion of the first case 8 at the other side in the longitudinal direction. The other one of the support rubbers 61 may be configured so that the whole part thereof projects outwardly from the opening portion of the first case 8 at the other side in the longitudinal direction.

As for an assembly order, the actuator body 4 may be housed in the first case 8 after the support unit 6 is housed in the first case 8, or both of the actuator body 4 and the support unit 6 in a state the support unit 6 is installed in the actuator body 4 may be housed in the first case 8.

In the above-described state, the second case 9 is attached to the first case 8. First, attaching the second case 9 to the first case 8 is started by inserting the second case 9 into the first case 8 so that the opening portion of the first case 8 at the other side in the longitudinal direction is interposed between the engaging arms 91. Then, as the second case 9 is pressed into the first case 8 toward the one side from the other side in the longitudinal direction, the engaging arms 91 of the second case 9 are guided by the guide portions 81 of the first case 8, and thus, the engaging arms 91 are put onto the engaging projections 82 (only one engaging projection 82 shown in FIG. 1), respectively. Thereafter, the catch holes 92 catch the engaging projections 82, respectively, to be engaged thereto, and at the same time, the engaging arms 91 return back to a regular state from the state where the engaging arms 91 are on the engaging projections 82.

As described above, when the attaching the second case 9 to the first case 8 is performed by inserting the second case 9 from the other side in the longitudinal direction, the electrode 57 provided on the inner surface of the second short side wall portion 54 of the second case 9 contacts on the other one of the support rubbers 61 of the support unit 6 from the other side in the longitudinal direction. Then, as the second case 9 is attached, the support rubber 61 is pressed toward the one side in the longitudinal direction. As a result, as shown in FIG. 11, the one of the support rubbers 61 is compression-deformed between the first short side wall portion 53 and one of side surfaces of the actuator body 4 at the one side in the longitudinal direction, and the other one of the support rubbers 61 is compression-deformed between the second short side wall portion 54 and the other one of the side surfaces of the actuator body 4 at the other side in the longitudinal direction.

When the support rubbers 61 are compression-deformed, the connection rubber 63 is also compression-deformed. Specifically, when the second case 9 is pressed further after the electrode 57 provided on the inner surface of the second short side wall portion 54 of the second case 9 has become to abut on the other one of the support rubbers 61 of the support unit 6 from the other side in the longitudinal direction, the pressing portion 54a provided on the second short side wall portion 54 of the second case 9 abuts on the long side portion 64 of the connection rubber 63 from the other side in the longitudinal direction. Then, when the second case 9 is still further pressed, the long side portion 64 is displaced toward the one side in the longitudinal direction to abut on the pressing portion 53a of the first short side wall portion 53, and is compression-deformed by the pressing portion 53a and the pressing portion 54a of the second short side wall portion 54. In this case, as shown in FIG. 9(b), each of the thin-walled portions 67 provided to the long side portion 64 is deformed to be largely curved, and therefore, the long side portion 64 is easily compression-deformed.

In the above-described manner, the second case 9 is attached to the first case 8, and the support rubbers 61 and the connection rubber 63 of the support unit 6 are compression-deformed in the longitudinal direction. Thus, assembly of the ultrasonic actuator 2 is completed.

As shown in FIG. 2 and FIG. 11, in the ultrasonic actuator 2 assembled in the above-described manner, the actuator body 4 is housed in the case 5 in a state where the driver elements 7 protrude outside, and the support unit 6 is interposed between the actuator body 4 and the case 5.

In this state, one of the support rubbers 61 is interposed between the external electrode 46 of the actuator body 4 and the electrode 56 of the case 5 to provide electrical conduction between the external electrode 46 and the electrode 56, and the other one of the support rubbers 61 is interposed between the external electrode 47 of the actuator body 4 and the electrode 57 of the case 5 to provide electrical conduction between the external electrode 47 and the electrode 57. The bias rubber 62 is interposed between the external electrode 48 of the actuator body 4 and the electrode 58 of the case 5 to provide electrical conduction between the external electrode 48 and the electrode 58.

As described above, in the support unit 6 having an approximately square U-shape, the support rubbers 61 and the bias rubber 62 are elastically deformed in the above-described assembly step by providing the support rubbers 61 and the bias rubber 62 so that each of them protrudes from the connection rubber 63 toward the actuator body 4 (inwardly) and the case 5 (outwardly). Thus, alternating voltages can be stably supplied to the actuator body 4.

That is, the support rubbers 61 and the bias rubber 62, each being formed of conductive rubber, support and bias the actuator body 4 in the above-described manner, and also functions as a power supply unit for supplying power from the case 5 to the actuator body 4. To achieve the function as a power supply unit, it is necessary to cause a certain amount of compression deformation of the support rubbers 61 and the bias rubber 62 and thereby press the support rubbers 61 and the bias rubber 62 to the external electrodes of the actuator body 4 and the electrode of the case 5 with an adequate repelling force (elastic force) maintained. If this repelling force is small, each of the support rubbers 61 and the bias rubber 62 might be spaced from an associated one of the external electrodes and the electrodes due to temperature change, external shock or vibration, the operation of the actuator body 4 or the like. When a space exists even momentarily, sparks fly and the temperature of each of the support rubbers 61 and the bias rubber 62 is locally increased to a very high temperature, so that conductive rubber is deteriorated to lose its electrical conductivity. Conductive rubber which has been once in this state has lost its conductivity, and thus cannot properly supply power to the actuator body 4.

Therefore, the support rubbers 61 and the bias rubber 62 are provided so that each of them protrudes from the connection rubber 63 toward the actuator body 4 (inwardly) and the case 5 (outwardly). Thus, in the assembly step, the support rubbers 61 and the bias rubber 62 are compression-deformed by the actuator body 4 and the case 5 without being disturbed by the connection rubber 63, and each of the support rubbers 61 and the bias rubber 62 can be placed between an associated one of the external electrodes of the actuator body 4 and an associated one of the electrodes of the case 5 with adequate repelling force maintained.

Moreover, the second case 9 is attached to the first case 8, and thereby the support rubbers 61 are compression-deformed in the longitudinal direction. Thus, the actuator body 4 is elastically supported with respect to the case 5 in the longitudinal direction and compression force is applied to the actuator body 4 inwardly from both sides in the longitudinal direction, i.e., in the vibration direction of longitudinal vibration. Each of the short side surfaces of the actuator body 4 on which the support rubbers 61 abut is an antinode, i.e., an non-node portion of longitudinal vibration. However, because the support rubbers 61 are elastic bodies, the support rubbers 61 do not disturb longitudinal vibrations of the actuator body 4. The term "non-node portion" used herein means a part of vibration other than nodes of vibration.

The ultrasonic actuator 2 configured in the above-described manner is mounted on the stage 11 so that the longitudinal direction of the actuator body 4 is in parallel to the longitudinal direction of the guides 12 and the driver elements 7 abut on one of surfaces of the stage 11 which is parallel to the guides 12. In this case, the ultrasonic actuator 2 is arranged so that the case 5 is fixed to a base with the driver elements 7 pressed to the stage 11 to cause compression-deformation of the bias rubber 62. That is, when the ultrasonic actuator 2 is mounted on the stage 11, the actuator body 4 is biased by the bias rubber 62 in the direction in which the actuator body 4 abuts on the stage 11, i.e., in the normal direction (matched to the lateral direction) of the long side surface of the actuator body 4 (i.e., the piezoelectric element unit 40) on which the driver elements 7 are provided.

Moreover, signal lines extending from a control unit (now shown) are electrically coupled to the terminal electrodes 56a, 57a and 58a of the case 5 via respective connect pins.

The control unit receives an external operation command and applies alternating voltages having a frequency corresponding to the operation command to the terminal electrodes 56a and 57a, respectively, with a phase difference according to the operation command.

As described above, the control unit induces the actuator body 4, i.e., the piezoelectric element unit 40 to generate longitudinal vibration and bending vibration in a cooperated manner and thus causes the driver elements 7 to make an orbit motion in the manner shown in FIGS. 8(a)-8(d), thereby moving the stage 11. Specifically, to prevent abnormal heat generation in the piezoelectric element unit 40, alternating voltages having a slightly higher frequency than a common resonance frequency for both longitudinal vibration and bending vibration of the piezoelectric element unit 40 are applied to the terminal electrodes 56a and 57a. In this case, the alternating voltages applied to the terminal electrodes 56a and 57a have different phases from one another by 90°.

When the actuator body 4 generates composite vibration of longitudinal vibration and bending vibration, each of the driver elements 7 makes an approximately elliptical motion in a plane including the longitudinal direction and the lateral direction of the actuator body 4. Thus, the driver elements 7 give driving force to the stage 11 through friction force along the longitudinal direction of the actuator body 4 while periodically repeating abutting on and separation from the stage 11, so that the stage 11 is moved along the guides 12. The longitudinal direction (coinciding with the direction in which the guides 12 extend) of the actuator body 4 corresponds to a driving direction in which the driver elements 7 output driving force.

The driving of the stage 11 by the ultrasonic actuator 2 will be described hereinafter in greater detail with reference to FIGS. 12(a), 12(b) and 12(c). When the actuator body 4 expands in the longitudinal direction (vibration direction of longitudinal direction), as shown in FIG. 12(b), one of the driver elements 7 (for example, shown on the left side of FIG. 12(a)-12(c)) is displaced in a region close to the stage 11 in the lateral direction (vibration direction of bending direction). Thus, friction force with the stage 11 is increased, so that the stage 11 is moved by the friction force to the side (the left side of FIGS. 12(a)-12(c)) to which the one of the driver elements 7 is displaced in the longitudinal direction. In this case, the other one of the driver elements 7 (shown on the right side of FIGS. 12(a)-12(c)) is displaced in the opposite direction to the direction in which the one of the driver elements 7 is displaced in the longitudinal direction. However, because the other one of the driver elements 7 is displaced in a region less close to the stage 11 in the lateral direction (where the other one of the driver elements 7 moves away from the stage 11), the other one of the driver elements 7 moves away from the stage 11 and friction force does not act. Thus, the other one of the driver elements 7 hardly affects the movement of the stage 11.

When the actuator body 4 contracts in the longitudinal direction, as shown in FIG. 12(c), the other one of the driver elements 7 (shown on the right side of FIGS. 12(a)-12(c)) is displaced in a region closer to the stage 11 in the lateral direction. Thus, friction force with the stage 11 is increased, so that the stage 11 is moved by the friction force to the side (the left side of FIGS. 12(a)-12(c)) to which the other one of the driver elements 7 is displaced in the longitudinal direction. This moving direction is the same direction as the moving direction of the stage 11 by the one of the driver elements 7 when the actuator body 4 expands, which has been described above. In this case, the one of the driver elements 7 (shown on the left side of FIGS. 12(a)-12(c)) is displaced toward the opposite direction to the direction in which the other one of the driver elements 7 is displaced in the longitudinal direction. However, because the one of the driver elements 7 is displaced in a region less close to the non-stage 11 in the lateral direction, the one of the driver elements 7 moves away from the stage 11 and friction force does not act. Thus, the one of the drive elements 7 hardly affects the movement of the stage 11.

Figure 12:
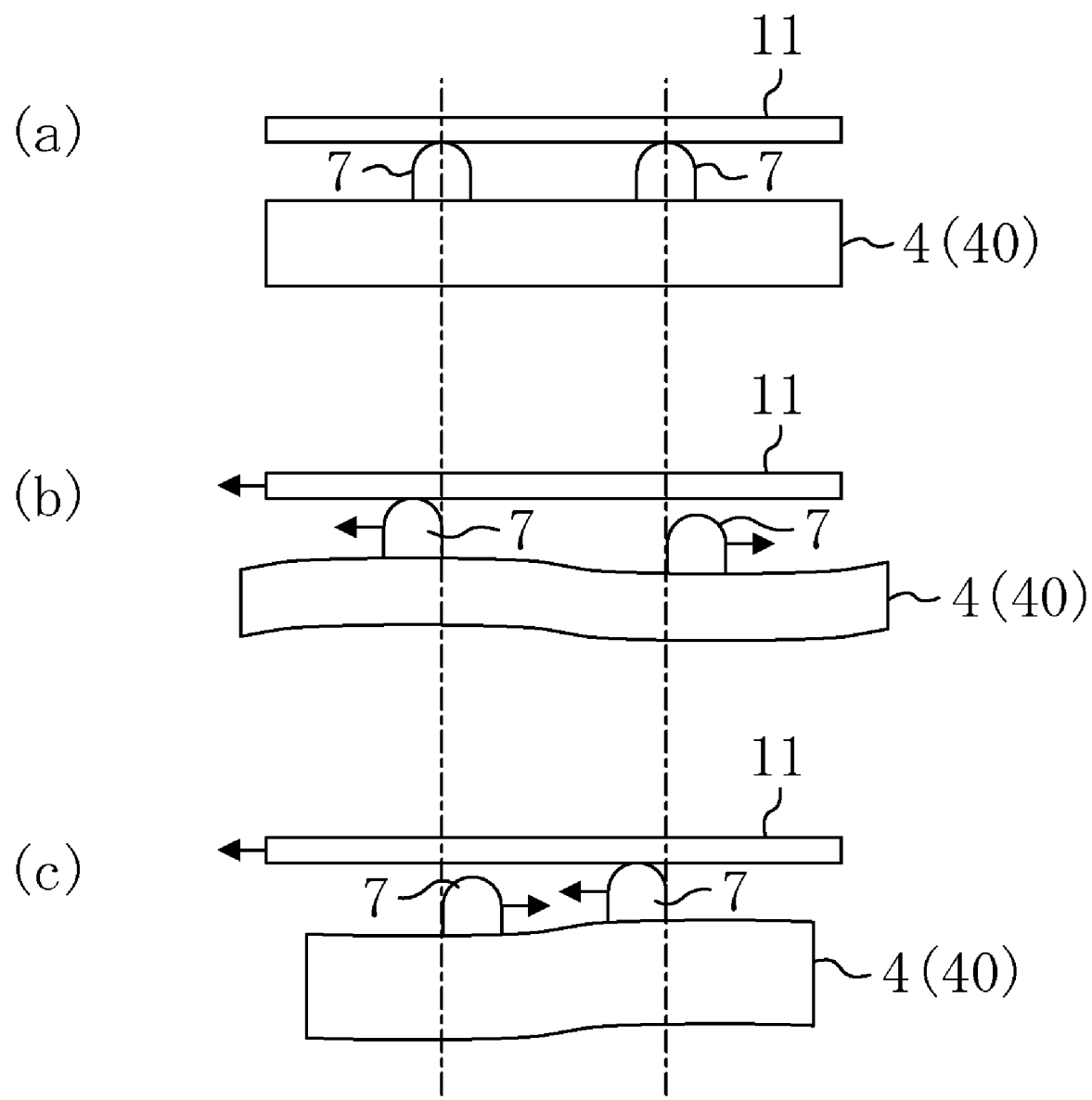
FIGS. 12(*a*)-12(*c*) are conceptual diagrams describing how a stage is driven by an ultrasonic actuator.

In FIG. 12, the driver element 7 which does not affect the movement of the stage 11 is separated from the stage 11, but it does not have to be separated. That is, the driver element 7 may be abutting on the stage 11 by friction force which is small enough not to move the stage 11.

In this manner, the one of the driver elements 7 and the other one of the driver elements 7 alternately move the stage 11 in a predetermined direction with phases shifted from one another by 180°. By applying alternating voltages having phases shifted from one another by −90° are applied to the terminal electrodes 56a and 57a, respectively, the direction of driving force output by the driver elements 7 can be reversed, so that the stage 11 can be moved in the other direction.

The amount of movement, moving speed and acceleration rate of the moving speed of the stage 11 can be adjusted by adjusting at least one of the voltage values, frequency and supply time of alternating voltages to be supplied to the terminal electrodes 56a and 57a, by changing a phase difference for each of alternating voltages to be applied to the terminal electrodes 56a and 57a, or like method.

As described above, the ultrasonic actuator 2 drives the stage 11 while causing each of the driver elements 7 to make an orbit motion in a plane including the vibration direction (longitudinal direction) of longitudinal vibration and the vibration direction (lateral direction) of bending vibration and thereby repeating increase and reduction in friction force between each of the driver elements 7 and the stage 11.

When the ultrasonic actuator 2 is operated in the above-described manner, the actuator body 4 is vibrated and thereby the same level of compressive stress and tensile stress are generated in the piezoelectric element layers 41. The piezoelectric element layers 41 are formed of a brittle material such as ceramic, crystal or the like. Such a brittle material has compressive strength which is several times larger than tensile strength. That is, the piezoelectric element layers 41 are weak to tensile-deformation. Therefore, when high power, i.e., power of about 10 mW to 10 W is input to the ultrasonic actuator 2 and displacement of each of the piezoelectric element layers 41 is increased, distortion in the tensile direction of the piezoelectric element layer 41 might exceed an elastic limit, and thus, the piezoelectric element layers 41, i.e., the actuator body 4 might be damaged.

In contrast, in the ultrasonic actuator 2 according to this embodiment, compression force is applied in advance, by the support rubbers 61, at non-node portions (specifically, antinodes of the longitudinal vibration) of the actuator body 4 in parallel to the vibration direction of longitudinal vibration. Thus, compared to compressive stress generated in the piezoelectric element layers 41, tensile stress is small, and accordingly, even when deformation of the piezoelectric element layers 41 is increased, tensile stress hardly exceeds the elastic limit of the piezoelectric element layers 41. Therefore, damage of the actuator body 4 can be prevented, and reliability of the actuator body 4 can be improved.

Moreover, compression force is preferably applied to the actuator body 4 symmetrically about the centroid of the actuator body 4. Thus, symmetry property of the longitudinal vibration and bending vibration is maintained, so that an elliptical motion of each of the driver elements 7 is stabilized and stable properties of the ultrasonic actuator 2 can be achieved. Specifically, when compression force is applied in parallel to the vibration direction of longitudinal vibration in the longitudinal direction, compression force is preferably applied to parts which are symmetric in the width direction and the thickness direction of the actuator body 4.

Furthermore, as an advantage of a configuration in which compression force is applied to the actuator body 4 in advance, an excellent function, i.e., the function of adjusting a difference (i.e., correlation) between respective resonance frequencies of longitudinal vibration and bending vibration can be achieved. Specifically, the resonance frequency [Hz] of the first-order mode of longitudinal vibration of the actuator body 4 and the resonance frequency [Hz] of the second-order mode of bending vibration are substantially expressed by the following Equations (1) and (2).

$$f_{L1} = \frac{1}{2L}\sqrt{\frac{E}{\rho}} \qquad \text{[Equation 1]}$$

$$f_{B2} = \frac{7.853W}{2\pi L^2}\sqrt{\frac{E}{12\rho}} \qquad \text{[Equation 2]}$$

In Equations (1) and (2), L is a length [m] of the actuator body 4 in the vibration direction of longitudinal vibration, W is a length [m] of the actuator body 4 in the vibration direction of bending vibration, E is a Young's module [Pa] of the actuator body 4, and p is a density [kg/m³] of the actuator body 4. However, actual resonance frequencies vary due to variations in production, the size of the driver elements 7 to be attached to the actuator body 4, variations in locations at which the driver elements 7 are attached, and the like.

Therefore, compression force is applied to the actuator body 4, and thereby, a resonance frequency can be changed to be closer to a desired resonance frequency.

A method for adjusting a frequency will be specifically described below. With the driver elements 7 formed on the actuator body 4, predetermined standard compression force is applied from both end surfaces of a piezoelectric element at both sides in the vibration direction of longitudinal vibration of the piezoelectric element toward the center portion of the piezoelectric element. Then, a resonance frequency $f_{L1}$ of the first-order mode of longitudinal vibration and a resonance frequency $f_{B2}$ of the second-order mode of bending vibration are measured. In this case, the resonance frequencies of bending vibration and longitudinal vibration, which are matched to one another in terms of design, might be slightly different from one another due to variations in production (in a fabrication step and a assembly step).

The actuator body 4 is mounted with compression force applied by the support rubbers 61 in the same direction as the vibration direction of longitudinal vibration toward the center portion from both end surfaces of the actuator body 4 in the longitudinal direction. In this case, several different types of support rubbers 61 having different dimensions in the direction (i.e., in the lateral direction or the thickness direction of the actuator body 4) perpendicular to the direction in which the support rubbers 61 are compressed are prepared in advance. Then, the dimensions of the support rubbers 61 used in mounting the actuator body 4 in the case are changed, and thereby, compression force applied to the actuator body 4 is changed, so that the resonance frequency of the actuator body 4, specifically, the resonance of the second-order mode of bending vibration can be changed.

For example, when the resonance frequency $f_{B2}$ of bending vibration is smaller than the resonance frequency $f_{L1}$ of longitudinal vibration ($f_{B2} < f_{L1}$), the actuator body 4 is installed in the case 5 using the support rubbers 61 having larger dimensions than the standard dimensions so that larger compression force than that in a standard state is applied to the actuator body 4. On the other hand, when the resonance frequency $f_{B2}$ of bending vibration is larger than the resonance frequency $f_{L1}$ of longitudinal vibration ($f_{B2} > f_{L1}$), the actuator body 4 is installed in the case 5 using the support rubbers 61 having smaller dimensions than the standard dimensions so that smaller compression force than that in a standard state is applied to the actuator body 4. Moreover, when the difference between the resonance frequency $f_{B2}$ of bending vibration and the resonance frequency $f_{L1}$ of longitudinal vibration is very small ($f_{B2} \cong f_{L1}$), the actuator body 4 is installed in the case 5 using the support rubbers 61 having the predetermined standard dimensions. Thus, even when there are variations in production, the resonance frequency of longitudinal vibration and the resonance frequency of bending vibration can be substantially matched to one another.

Note that in the above-described method, resonance frequencies are measured with compression force applied in advance only from the vibration direction of longitudinal vibration. When resonance frequencies are measured with the ultrasonic actuator 2 arranged to be pressed to the stage 11 and the driver elements 7 being in friction contact with the stage 11, even higher measurement accuracy can be achieved.

Moreover, in the above-described method, compression force to be applied to the actuator body 4 is adjusted by adjusting the dimensions of the support rubbers 61. However, compression force to be applied to the actuator body 4 may be adjusted by changing the material of the support rubbers 61, or by changing the dimensions of the case 5. Furthermore, in adjusting frequencies, the sizes of both of the support rubbers 61 are changed. However, compression force to be applied to the actuator body 4 may be adjusted by changing the size of only one of the support rubbers 61.

Also, frequencies are adjusted by applying compression force in the vibration direction of longitudinal vibration. However, resonance frequencies may be adjusted by applying compression force in the vibration direction of bending vibration.

In the above-described method, the resonance frequency of longitudinal vibration and the resonance frequency of bending vibration are adjusted to be substantially matched to each other. However, the resonance frequency of bending vibration may be purposely adjusted to be lower than the resonance frequency of longitudinal vibration. In the ultrasonic actuator 2, it is difficult to adjust the resonance frequency of longitudinal vibration and the resonance frequency of bending vibration so that they are exactly matched to each other. The ultrasonic actuator 2 is normally driven at a higher driving frequency than the resonance frequency of longitudinal vibration and the resonance frequency of bending vibration (i.e., alternating voltages having a higher frequency than the resonance frequency of longitudinal vibration and the resonance frequency of bending vibration are applied to the terminal electrodes 56a and 57a of the actuator body 4). In such a case, when the resonance frequency of longitudinal vibration is adjusted to be higher than the resonance frequency of bending vibration, the resonance frequency of longitudinal vibration is closer to the driving frequency than the resonance frequency of bending vibration, and thus, longitudinal vibration is generated more dominantly in the actuator body 4. Since the vibration direction of longitudinal vibration coincides to the moving direction of the stage 11, longitudinal vibration largely affects the highest velocity of the ultrasonic actuator 2. That is, with the resonance frequency of longitudinal vibration set to be higher than the resonance frequency of bending vibration, longitudinal vibration is dominantly generated in the actuator body 4 even when the resonance frequency of longitudinal vibration and the resonance frequency of bending vibration of the actuator body 4 are changed due to change of an ambient temperature or the like. This method results in the advantage that the highest velocity of the ultrasonic actuator 2 is hardly changed when the ultrasonic actuator 2 is driven with changed driving frequency.

In adjusting frequencies, the resonance frequency of bending vibration may be purposely adjusted to be higher than the resonance frequency of longitudinal vibration. As described above, the ultrasonic actuator 2 for generating two vibrations (i.e., longitudinal vibration and bending vibration) having different vibration directions is normally driven at a higher driving frequency than either the resonance frequency of longitudinal vibration or the resonance frequency of bending vibration. In general, the bandwidth of bending vibration is narrow. Therefore, bending vibration of the actuator body 4 can be sufficiently generated by adjusting the resonance frequency of bending vibration to be higher than the resonance frequency of longitudinal vibration because the resonance frequency of bending vibration is closer to the driving frequency, compared to the case where the resonance frequency of bending vibration is lower than the resonance frequency of longitudinal vibration. Since the bandwidth of longitudinal vibration is wider than the bandwidth of bending vibration, even when the resonance frequency of longitudinal vibration is far from the driving frequency, longitudinal vibration can be generated in the actuator body 4. Moreover, when the driving frequency has become far from the resonance frequency of longitudinal vibration, the change of the highest velocity of the ultrasonic actuator when the driving frequency is changed and then the ultrasonic actuator is driven is gradual, compared to the case where the driving frequency is changed around the resonance frequencies. Therefore, this method has the advantage that the ultrasonic actuator can be stably operated even in a low-speed area.

As described above, in the ultrasonic actuator 2 in which compression force is applied to the actuator body 4 in advance, compression-deformed pressurizing members (the support rubbers 61 in this embodiment) have to be provided between the actuator body 4 and the case 5. If each of elastic bodies in such a compression-deformed state is inserted in a space between the actuator body 4 and the case 5, a certain level of force is required in inserting it, and it is difficult to place each of the support rubbers 61 at a desired mounting position in the space between the actuator body 4 and the case 5. That is, the assembly property and productivity are low.

According to this embodiment, the plurality of the support rubbers 61 are connected to one another by the connection rubber 63 to form the support unit 6, and the case 5 has a separate configuration including the first case 8 and the second case 9. Thus, the actuator body 4 and the support unit 6 are first placed in the first case 8 to roughly determine positions of the support rubbers 61, and then, in this state, the second case 9 is attached, so that the support rubbers 61 in a compression-deformed state are placed at desired positions between the actuator body 4 and the case 5. Therefore, there is no need to insert the compression-deformed support rubbers 61 to a small space because the support rubbers 61 are compression-deformed when the second case 9 is attached to the first case 8, so that force required for assembly can be reduced. Moreover, positions of the support rubbers 61 are roughly determined by the support unit 6, and thus, positioning accuracy in assembling can be also improved.

However, in the above-described configuration, the following problems arise.

Figure 13:
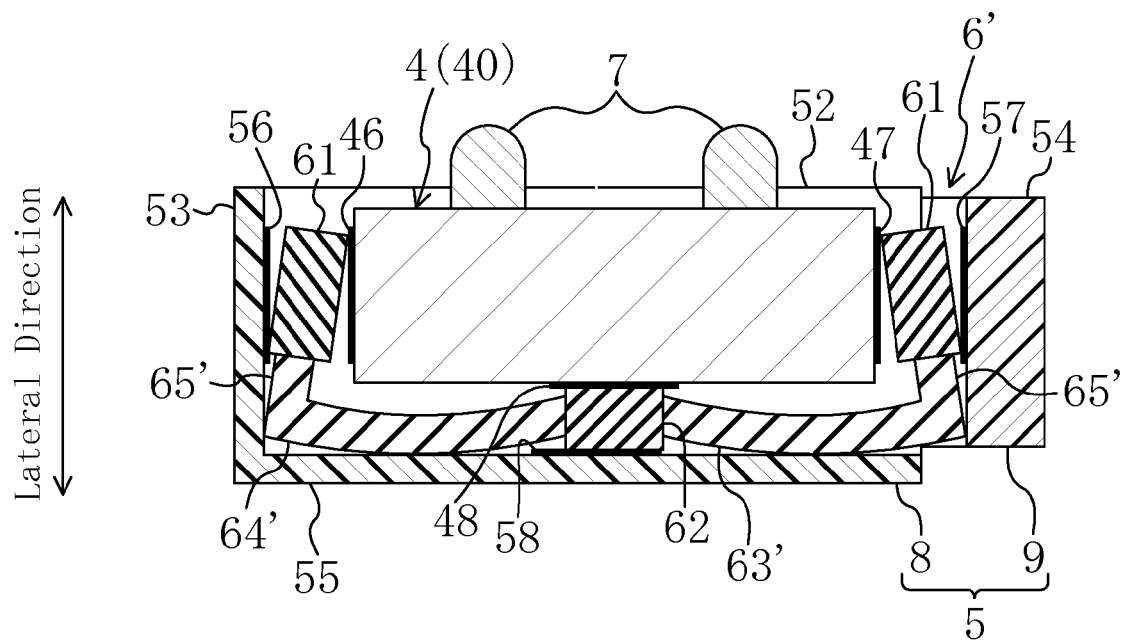
FIG. 13 is a cross-sectional view of an ultrasonic actuator according to a reference example.

Specifically, as shown in FIG. 13, assume that a support unit 6' in which the support rubbers 61 and the bias rubber 62 are connected to one another by a simple connection rubber 63' which does not include the reduced-material portions 66 is provided. When the second case 9 is attached to the first case 8 and then the support rubbers 61 of the support unit 6' are pressed inwardly from both sides in the longitudinal direction of the actuator body 4, the support unit 6' is deformed such that the support rubbers 61 inwardly lean. The support rubbers 61 are placed at short side portions 65' extending upright from a long side portion 64', i.e., at offset positions in the lateral direction of the actuator body 4. Thus, when compression force in the longitudinal direction of the actuator body 4 acts on the support rubbers 61, a moment which causes the short side portions 65' to inwardly lean is generated. This moment acts in the direction which causes both of end portions of the long side portion 64' of the connection rubber 63' to be lifted up.

The long side portion 64' of the connection rubber 63' is flat in the lateral direction of the actuator body 4, i.e., a dimension of the long side portion 64' in the lateral direction of the actuator body 4 is smaller than a dimension of the long side portion 64' in the thickness direction of the actuator body 4. Thus, when compression force acts in a longitudinal direction of the long side portion 64', the long side portion 64' in the lateral direction of the actuator body 4 easily buckles Furthermore, as described above, since a moment which causes the short side portions 65' to inwardly lean acts on both of end portions of the long side portion 64', buckling in the lateral direction of the actuator body 4 is easily caused. Even if such a phenomenon does not occur in assembling, it might occur later due to temperature change and the like.

Due to such a moment and buckling, parts of the support rubbers 61 are lifted up in the lateral direction of the actuator body 4 and lean. Even if the support rubbers 61 are pressed by the actuator body 4 and the case 5 and are forced to lie along a space between the actuator body 4 and the case 5, unnecessary stress is generated in the support rubbers 61 due to deformation of the connection rubber 63'. Accordingly, the compressibility of the support rubbers 61 becomes nonuniform in the lateral direction. When the support rubbers 61 have reached such a state, a space tends to be created between each of the support rubbers 61 and the external electrode 46 (47) and the electrode 56 (57), so that the support rubbers 61 might be deteriorated to lose conductivity, as has been described above.

In this embodiment, the thin-walled portions 67 are provided to the long side portion 64 of the connection rubber 63 to allow the long side portion 64 of the connection rubber 63 to be easily deformed in the compression direction when the support unit 6 is compression-deformed, thereby preventing shifts of the positions of the support rubbers 61 from desired positions or influences of the connection rubber 63 on a compression state of each of the support rubbers 61.

Specifically, the thin-walled portions 67 are provided to the connection rubber 63, and thus, when compression force is applied to the connection rubber 63 in the longitudinal direction, the thin-walled portions 67 are greatly deformed locally. Furthermore, a cross-section of each of the thin-walled portions 67 is flat in the thickness direction of the actuator body 4, and therefore, the thin-walled portions 67 is easily deformed in the thickness direction but is hardly deformed in the lateral direction of the actuator body 4. That is, even when compression force acts on the long side portion 64 in the longitudinal direction and also a moment which causes the short side portions 65 to inwardly lean acts, the long side portion 64 is not buckled in the lateral direction of the actuator body 4, and, as shown in FIG. 9(*b*), the long side portion 64 is deformed so that the thin-walled portions 67 outwardly expand in the thickness direction of the actuator body 4. As a result, as for the connection rubber 63, the long side portion 64 is easily compression-deformed in the longitudinal direction of the long side portion 64 due to deformation of the thin-walled portions 67, thus preventing the connection rubber 63 from being greatly curved due to buckling and the above-described moment and from applying unnecessary force to the support rubbers 61. As a result, the support rubbers 61 can be placed at desired positions and also can be compression-deformed so that the compressibility of the support rubbers 61 is uniform in the lateral direction of the actuator body 4.

Furthermore, since the pressing portions 53a and 54a are provided to the case 5, in the support unit 6, the support rubbers 61 are first pressed inwardly in the longitudinal direction by the first case 8 and the second case 9 when the second case 9 is attached to the first case 8. Then, the pressing portion 53a of the first case 8 and the pressing portion 54a of the second case 9 abut respectively on both of end portions of the long side portion 64 of the connection rubber 63 in the longitudinal direction to press the long side portion 64 in the longitudinal direction of the long side portion 64. Accordingly, even when a moment which causes both of the end portions of the long side portion 64 to be lifted up toward the actuator body 4 acts, the long side portion 64 is forcibly compression-deformed in the longitudinal direction of the long side portion 64 due to compression force from the pressing portion 53a and the pressing portion 54a. Thus, it is possible to more reliably prevent the connection rubber 63 from being largely curved due to buckling and the above-described moment and from thereby causing unnecessary force to act on the support rubbers 61. In this case, both of the end portions of the long side portion 64 in the longitudinal direction correspond to pressed portions.

It is preferable that the amount of a portion of each of the pressing portions 53a and 54a protruding from the inner surface of an associated one of the first and second short side wall portions 53 and 54 is substantially matched to a difference between the amount of a portion of each of the support rubbers 61 protruding from the short side portions 65 toward the case 5 before assembling and the amount thereof after assembling (i.e., after compression-deformation).

Accordingly, rubbers 61 are uniformly compression-deformed in the lateral direction of the actuator body 4 only by pressing the second case 9 to the first case 8, so that supply of alternating voltages to the actuator body 4 can be stabilized. Moreover, even when environmental changes such as change in temperature and the like occur, the thin-walled portions 67 are deformed to adjust compression distortion, so that force supporting the actuator body 4 in the longitudinal direction of the actuator body 4 can be maintained constant.

Therefore, according to Embodiment 1, tensile stress is reduced by applying compression force to antinodes of vibrations of the actuator body 4, compared to compression stress generated in the actuator body 4 along with vibration of the actuator body 4. Thus, even when deformation of the actuator body 4 is increased, distortion caused by tensile stress hardly exceeds the elastic limit of the actuator body 4, specifically, the piezoelectric element layers 41, and thus, damage of the actuator body 4 can be prevented. As a result, the reliability of the ultrasonic actuator 2 can be improved.

Furthermore, resonance frequencies of a plurality of vibrations can be adjusted by adjusting compression force to be applied by the support rubbers 61 in advance, so that the ultrasonic actuator 2 with small variations can be provided.

The actuator body 4 is supported with respect to the case 5 by the support rubbers 61 which are elastic bodies, and thereby, the actuator body 4 can be supported without disturbing vibrations of the actuator body 4. As a result, the efficiency of the ultrasonic actuator 2 can be improved.

Each of the support rubbers 61 is formed of conductive rubber, and the support rubbers 61 provide electrical conduction between each of the external electrodes 46 and 47 of the actuator body 4 and an associated one of the electrodes 56 and 57 of the case 5, so that connection portions for power supply lines do not have to be provided to the actuator body 4 by soldering. Therefore, cases where stress concentrates at parts of the actuator body 4 at which solder is provided to cause breaking of the actuator body 4 can be avoided. Moreover, solder disposed to bulging on a surface of the actuator body in the thickness direction is not needed, and thus, the thickness of the actuator body 4 can be reduced. Furthermore, the step of connecting the power supply lines by soldering can be removed, and thus, the number of steps in assembling the ultrasonic actuator 2 can be reduced and assembly property can be improved.

In the configuration in which the support rubbers 61 in a compression-deformed state are provided between the actuator body 4 and the case 5 to apply compress force to the actuator body 4 in advance, the assembly property can be improved by connecting the support rubbers 61 by the connection rubber 63 to form one unit. Also, with the thin-walled portions 67 having a low stiffness provided to the long side portion 64 of the connection rubber 63, the generation of unnecessary stress in the support rubbers 61 can be prevented in assembling, and thus, the support rubbers 61 can be compression-deformed with a constant compressibility. As a result, at the non-node portions of the actuator body 4, compression force at a predetermined value can be applied in advance in the vibration direction of the actuator body 4, and also can be stabilized. Moreover, since unnecessary external force from the connection rubber 63 does not act on the support rubbers 61, positioning of the support rubbers 61 can be carried out between the actuator body 4 and the case 5 with high accuracy.

In addition, in the configuration in which the support rubbers 61 for applying compression force to the actuator body 4 in advance provide electrical conduction between each of the external electrodes 46 and 47 of the actuator body 4 and an associated one of the electrodes 56 and 57 of the case 5, as described above, a constant compressibility of the support rubbers 61 is achieved, and thereby, when the ultrasonic actuator 2 is operated, it is possible to prevent the support rubbers 61 from being deteriorated and losing their electrical conductivity. Thus, electrical conduction between the actuator body 4 and the case 5 can be maintained.

Furthermore, according to this embodiment, the bias rubber 62 is provided to the long side portion 64 of the support unit 6. When the support unit 6 is placed in the case 5, the thin-walled portions 67 of the long side portion 64 are deformed, and the bias rubber 62 and a part of the long side portion 64 surrounding the bias rubber 62 are hardly deformed. Therefore, even when the support unit 6 is compression-deformed, the bias rubber 62 does not receive unnecessary external force from the long side portion 64, so that desired bias force can be applied to the actuator body 4 from the bias rubber 62. In addition, although the bias rubber 62 has the function of providing electrical conduction between the external electrode 48 of the actuator body 4 and the electrode 58 of the case 5, unnecessary force is not applied to the bias rubber 62 from the long side portion 64, and thus, a state where the bias rubber 62 is compression-deformed between the actuator body 4 and the case 5 can be maintained stable. As a result, when the ultrasonic actuator 2 is operated, it is possible to prevent the bias rubber 62 from being deteriorated and losing its electrical conductivity, so that electrical conduction between the actuator body 4 and the case 5 can be maintained.

The pressing portion 53a is provided to the first case 8 and the pressing portion 54a is provided to the second case 9. Thus, when the support rubbers 61 of the support unit 6 are compression-deformed inwardly in the longitudinal direction of the actuator body 4 while the first case 8 is being attached to the second case 9, the long side portion 64 of the connection rubber 63 can be pressed inwardly in the longitudinal direction of the long side portion 64, so that a moment generated by pressing the support rubbers 61 by the first case 8 and the second case 9 hardly affects the support unit 6. As a result, application of unnecessary external force to the support rubbers 61 and the bias rubber 62 by the connection rubber 63 can be more reliably prevented.

The shape of the thin-walled portions 67 is not limited the above-described shape. As long as the thin-walled portions 67 have a low stiffness than that of other portions of the long side portion 64, any shape can be employed. However, if the long side portion 64 is located outward of the actuator body 4 in the lateral direction so as not to be in contact with the actuator body 4 when the long side portion 64 is deformed, each of the thin-walled portions 67 preferably has a shape which can be easily deformed in the thickness direction of the actuator body 4. For example, in order that the thin-walled portions 67 are easily deformed in the thickness direction of the actuator body 4 when compression force is applied in the longitudinal direction, a traverse cross-section of each of the thin-walled portions 67 may have a rectangular shape and thus be flat in the thickness direction, and furthermore, a dimension of the traverse cross section in the thickness direction is preferably ¼ or less of a dimension of the actuator body 4 in the lateral direction.

The deformation of the thin-walled portions 67 is preferably buckling deformation. That is, the long side portion 64 does not have to receive compression force applied in the longitudinal direction of the long side portion 64. The long side portion 64 is preferably contracted in the longitudinal direction with as small load as possible.

Each of the reduced-material portions 66 is an approximately rectangular hole, but may be an oval hole. Moreover, in the rectangular hole of each of the reduced-material portions 66, fillets each having a circular arc shape are provided to allow the thin-walled portions 67 to easily open outwardly. As a result, the thin-walled portions 67 can be easily deformed so as to expand outwardly with respect to compression force applied in the longitudinal direction of the long side portion 64.

According to Embodiment 1, the ultrasonic actuator 2 includes the bias rubber 62, but a configuration in which the ultrasonic actuator 2 does not include the bias rubber 62 may be employed. That is, the ultrasonic actuator 2 may include any bias rubber, and a bias portion for biasing the actuator body 4 to a driving target such as the stage 11 or the like when the ultrasonic actuator 2 is mounted on the stage 11 or the like may be additionally provided. In such a case, an opening portion is preferably formed in the case 5 so that the bias portion abuts on a side surface of the actuator body 4 on which the driver elements 7 are not provided.

Embodiment 2

Next, an ultrasonic actuator 202 according to Embodiment 2 of the present invention will be described.

In the ultrasonic actuator 202 of Embodiment 2, a support unit 206 and a case 205 have different configurations from those of the support unit and the case of Embodiment 1.

Figure 14:
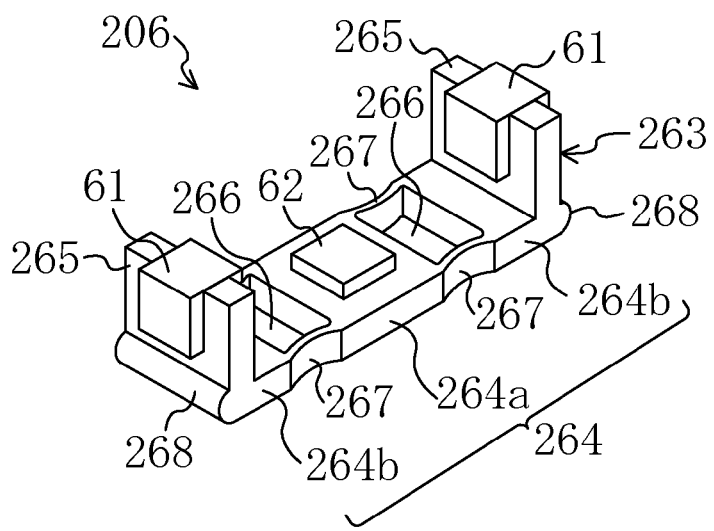
FIG. 14 is a perspective view of a support unit according to Embodiment 2.

Specifically, as shown in FIG. 14 and FIG. 15(a), in the support unit 206 of Embodiment 2, reduced-material portions 266 are formed in parts of a long side portion 264 each being located outward of the bias rubber 62 in the longitudinal direction, and thin-walled portions 267 are formed so that each of the reduced-material portions 266 is interposed between the thin-walled portions 267 in the same manner as in Embodiment 1. In a normal state (where force is not applied to the support unit 206), each of the thin-walled portions 267 is inwardly curved in a lateral direction of the long side portion 264 (which is the thickness direction of the actuator body 4).

At respective outer ends of end portions 264b of the long side portion 264 in the longitudinal direction, pressed portions 268 each outwardly protruding from an associated one of short side portions 265 in the longitudinal direction are provided. Each of the pressed portions 268 has a semicircular column shape whose axis extends in a lateral direction of the long side portion 264.

Figure 16:
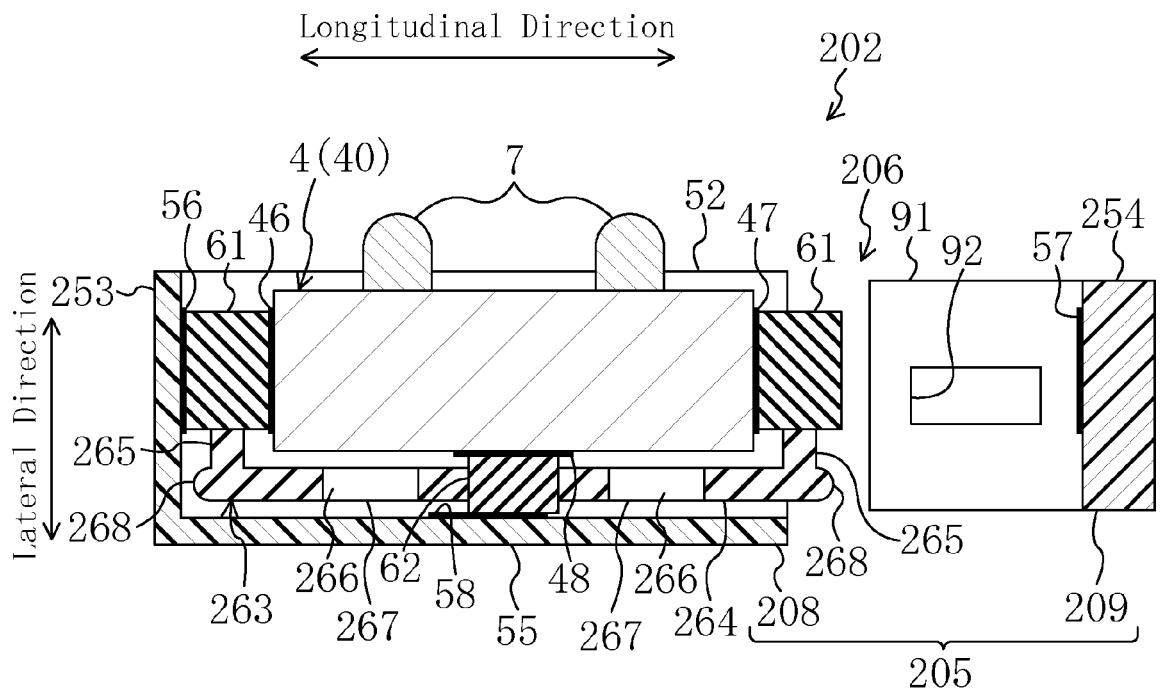
FIG. 16 is a cross-sectional view of an ultrasonic actuator before assembly.
Figure 17:
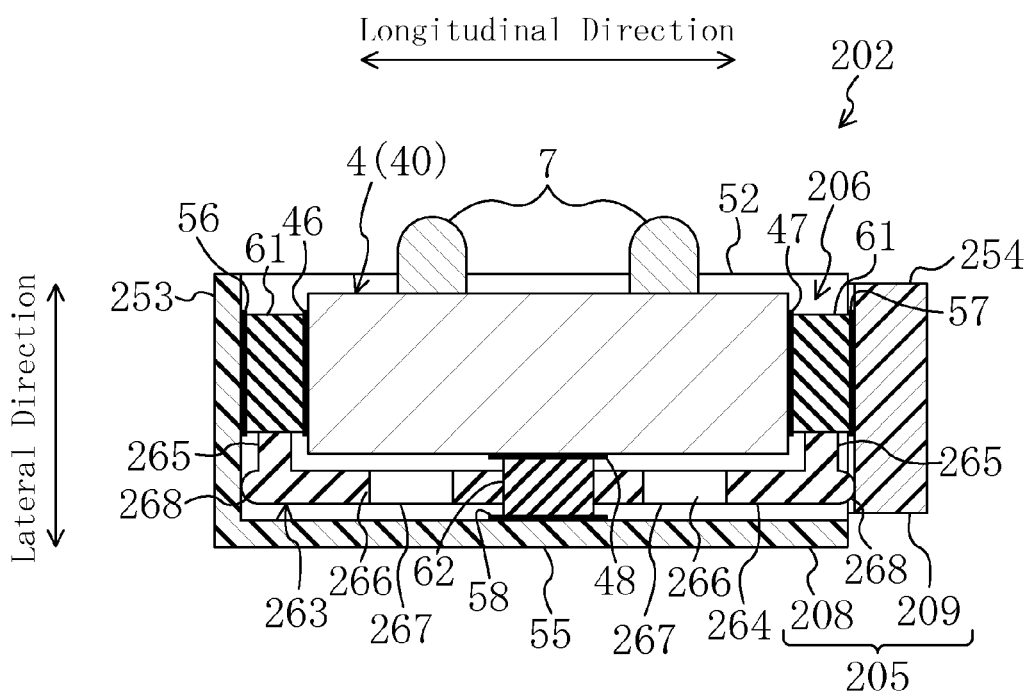
FIG. 17 is a cross-sectional view of the ultrasonic actuator after assembly.

As shown in FIG. 16, the pressing portions 53a and 54a of Embodiment 1 are not provided to the case 205. That is, an inner surface of a first short side wall portion 253 of a first case 208 is formed to be a uniform plane surface, and an inner surface of a second short side wall portion 254 of a second case 209 is also formed to be a uniform plane surface.

In assembling the ultrasonic actuator 202 configured in the above-described manner, the actuator body 4 and the support unit 206 are first housed in the first case 208. In this sate, the second case 209 is attached to the first case 208 by inserting the second case 209 from one side in the longitudinal direction of the actuator body 4. Note that the second case 209 is attached to the first case 208 in the same manner as in Embodiment 1. During the attaching of the second case 209 to the first case 208, the second short side wall portion 254 of the second case 209 abuts on an associated one of the support rubbers 61, thereby pressing the support rubber 61 toward the actuator body 4. Then, one of the support rubbers 61 is compression-deformed between the first short side wall portion 253 and the actuator body 4, and the other one of the support rubbers 61 is compression-deformed between the second short side wall portion 254 and the actuator body 4. Thus, during compression-deformation of the support rubbers 61, the inner surface of the first short side wall portion 253 and the inner surface of the second short side wall portion 254 abut on the pressed portions 268 of a connection rubber 263, respectively, thereby pressing the long side portion 264 of the connection rubber 263 in the longitudinal direction of the long side portion 264. As a result, the long side portion 264 is hardly affected by a moment which causes both of end portions of the long side portion 264 to be lifted up toward the actuator body 4, and is forcibly compression-deformed in the longitudinal direction by compression force from the first short side wall portion 253 and the second short side wall portion 254. In this case, the inner surface of the first short side wall portion 253 and the inner surface of the second short side wall portion 254 form pressing portions.

According to Embodiment 2, the thin-walled portions 267 are formed to be curved inwardly with respect to the longitudinal direction of the body portion, and thus, when compression force is applied in the longitudinal direction of the long side portion 264, the thin-walled portions 267 can be easily buckled, i.e., deformed. That is, the long side portion 264 can be easily compression-deformed by small force.

Figure 15:
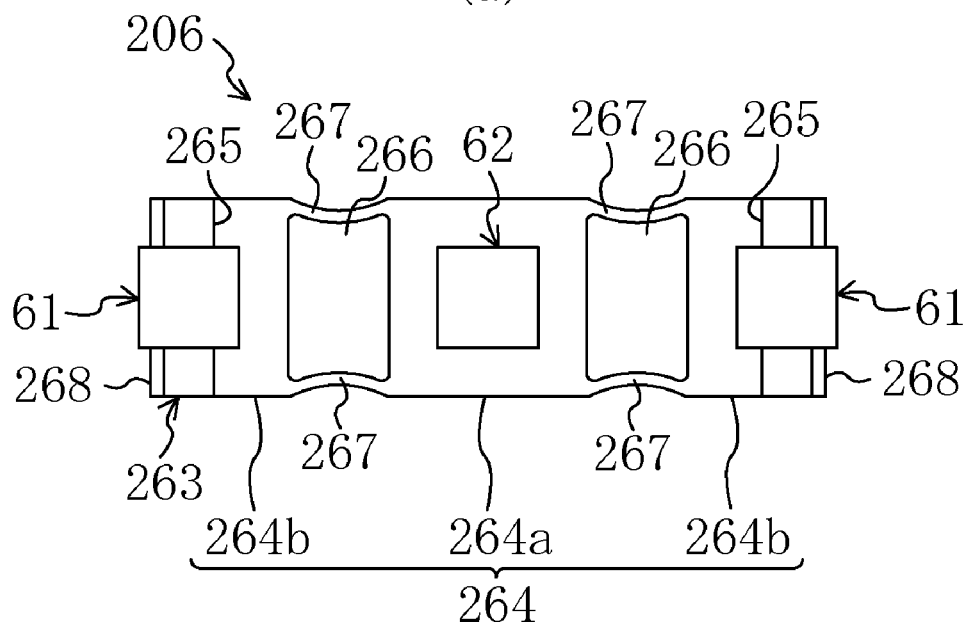
FIGS. 15(*a*) and 15(*b*) are plan views illustrating a support unit.
Figure 15:
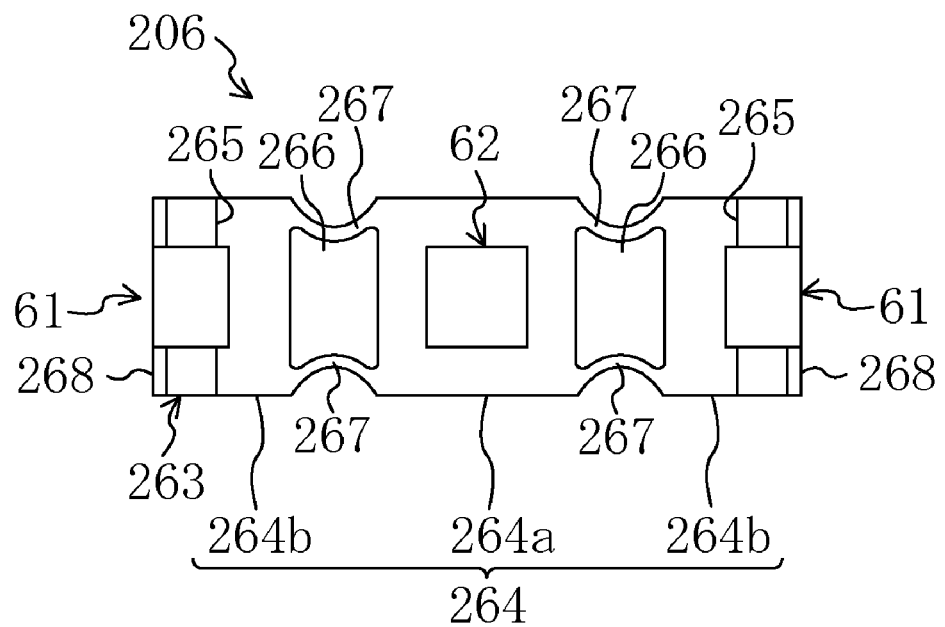

Furthermore, the thin-walled portions 267 are formed to be curved inwardly in the lateral direction of the long side portion 264, and thus, as shown in FIG. 15(*b*), the thin-walled portions 267 are deformed inwardly in the lateral direction when the long side portion 264 is compression-deformed, so that the thin-walled portions 267 do not expand outwardly from the long side portion 264 and can be compactly compression-deformed. Therefore, the size of the support unit 206, and consequently, the size of the ultrasonic actuator 202 can be advantageously reduced.

The pressed portions 268 each of which is formed to protrude toward the case 205 and abuts on an associated one of the first case 208 and the second case 209 to be pressed when the second case 209 is attached to the first case 208 are provided to the long side portion 264 of the connection rubber 263. Thus, when the support rubbers 61 of the support unit 206 are compression-deformed inwardly in the longitudinal direction of the actuator body 4 while the second case 209 is attached to the first case 208, the long side portion 264 of the connection rubber 263 can be pressed inwardly in the longitudinal direction of the long side portion 264, and thereby a moment generated by the first case 208 and the second case 209 pressing the support rubbers 61 hardly acts on the support unit 206. As a result, application of unnecessary external force to the support rubbers 61 and the bias rubber 62 by the connection rubber 263 can be more reliably prevented. In contrast to Embodiment 1 in which the pressing portion 53*a* is provided to the first case 8 and the pressing portion 54*a* is provided to the second case 9, in Embodiment 2, the pressed portions 268 are provided to the connection rubber 263 formed of a material having a heat expansion coefficient close to that of the support rubbers 61. Thus, even when a compression state of the compression-deformed support rubbers 61 is changed due to temperature change or the like, a compression state of the pressed portions 268 is accordingly changed in a similar manner, so that the generation of a moment in the support unit 206 can be prevented. Therefore, the compression state of the support rubbers 61 can be maintained stable, and power can be more stably supplied to the actuator body 4.

Furthermore, each of the pressed portions 268 is formed to have a semicircular column shape, and thus, the pressed portions 268 are in line contact with the first short side wall portion 253 of the first case 208 and the second short side wall portion 254 of the second case 209, respectively. Thus, the connection rubber 263 is not firmly in contact with an large area of each of the first short side wall portion 253 and the second short side wall portion 254, preventing the generation of unnecessary force and a moment caused by the connection rubber 263 being attached to each of the first short side wall portion 253 and the second short side wall portion 254 due to temperature change or the like. Also, even when each of the pressed portions 268 is formed to have a hemisphere shape and thus is in point contact with an associated one of the first short side wall portion 253 and the second short side wall portion 254, the similar effects can be achieved.

Embodiment 3

Next, an ultrasonic actuator 302 according to Embodiment 3 of the present invention will be described.

In the ultrasonic actuator 302 of Embodiment 3, a support unit 306 and a case 305 have different configurations from those of the support unit and the case of each of Embodiment 1 and Embodiment 2.

Figure 18:
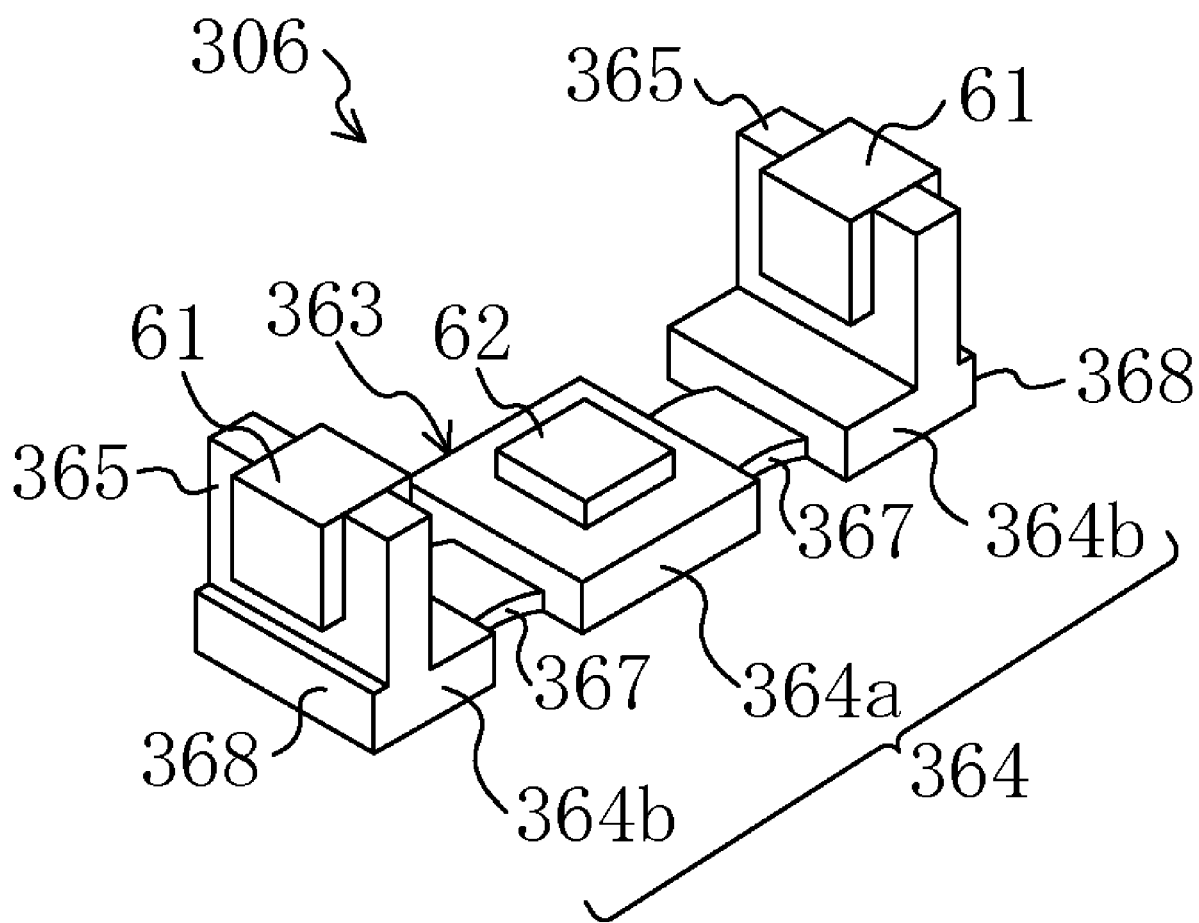
FIG. 18 is a perspective view of a support unit according to Embodiment 3.

Specifically, as shown in FIG. 18, in the support unit 306, a long side portion 364 includes a center portion 364*a*, end portions 364*b* located at both sides of the center portion 364*a* in the longitudinal direction, and thin-walled portions 367 for connecting the center portion 364*a* with the end portions 364*b*. The bias rubber 62 is inserted in the center portion 364*a* so as to pass through the center portion 364*a*. Short side portions 365 are provided respectively at both of the end portions 364*b* so as to extend upright therefrom. Pressed portions 368 each outwardly protruding from an associated one of the short side portions 365 in the longitudinal direction are provided respectively at both of the end portions 364*b*.

Each of the thin-walled portions 367 is a thin plate member which is flat in the thickness direction of the long side portion 364 (i.e., the lateral direction of the actuator body 4), and has a smaller traverse cross-section area than that of each of the center portion 364*a* and the end portions 364*b*. In a normal state (where force is not applied to the support unit 306), each of the thin-walled portions 367 is curved in the thickness direction of the long side portion 364 toward a side at which the actuator body 4 is to be provided.

Each of the pressed portions 368 has a prismatic column shape whose axis extends in a lateral direction of the long side portion 364. Surfaces of the pressed portions 368 which respectively face a first short side wall portion 353 and a second short side wall portion 354 are formed to be plane surfaces parallel to inner surfaces of the first short side wall portion 353 and the second short side wall portion 354. Thus, when the support unit 306 is housed in the case 305, each of the pressed portions 368 is in plane contact with an associated one of the inner surfaces of the first short side wall portion 353 and the second short side wall portion 354.

Figure 19:
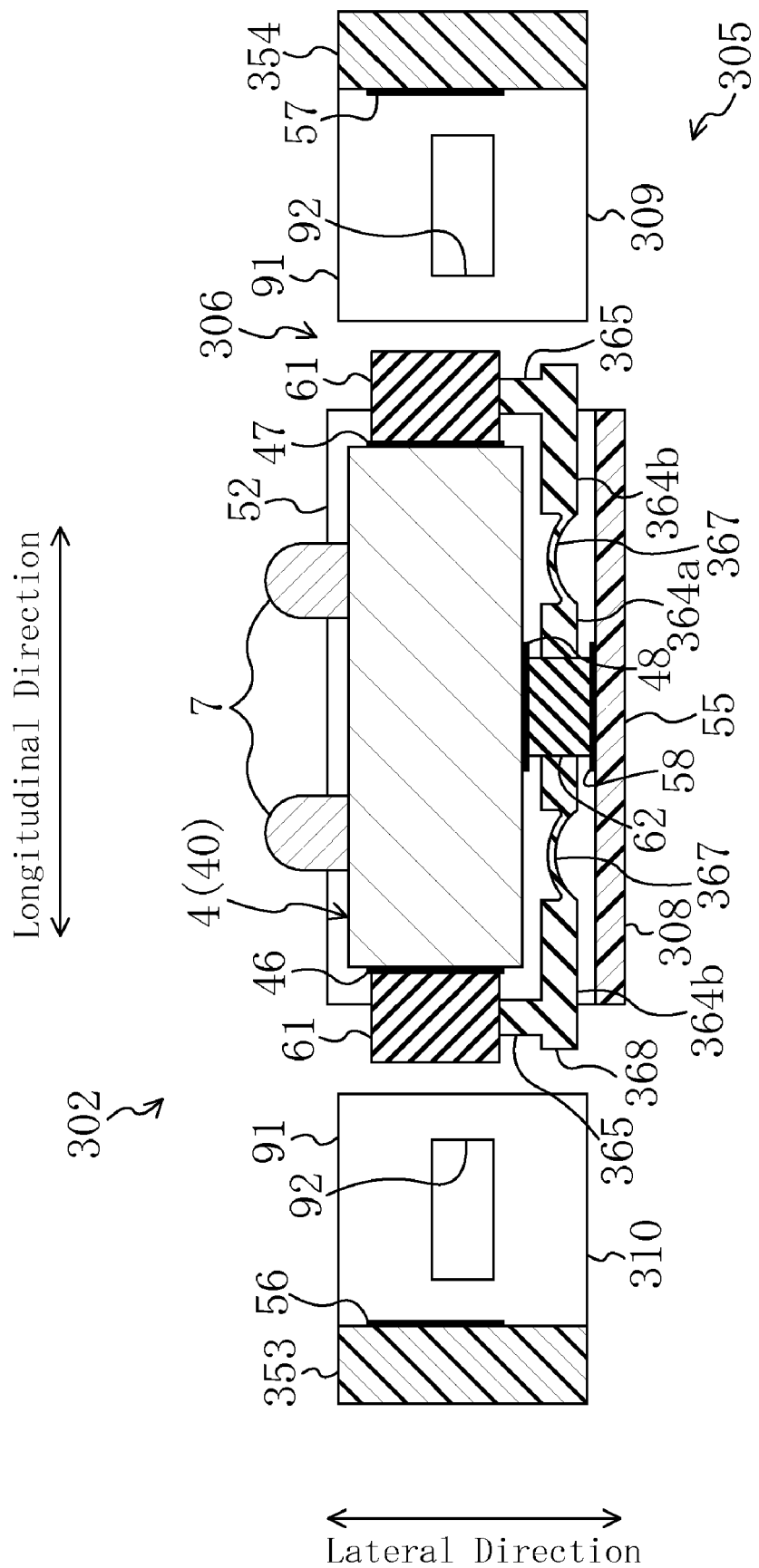
FIG. 19 is a cross-sectional view of an ultrasonic actuator before assembly.
Figure 20:
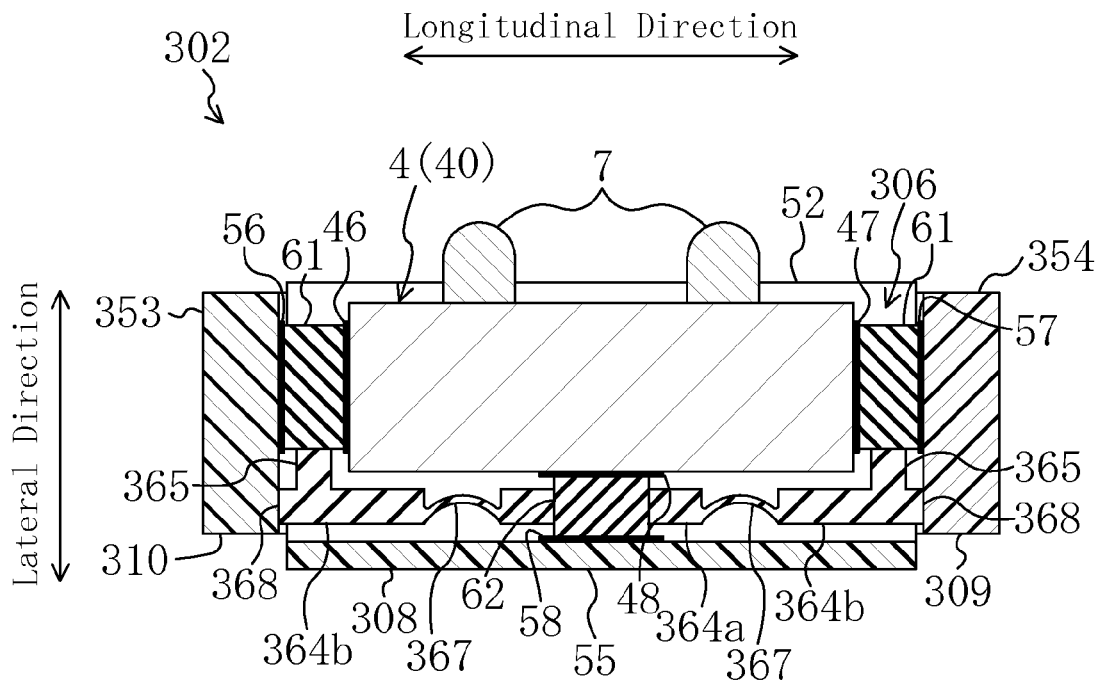
FIG. 20 is a cross-sectional view of the ultrasonic actuator after assembly.

As shown in FIG. 19, the case 305 has a tri-separate configuration including a first case 308, a second case 309, and a third case 310. The first case 308 includes two principal wall portions 52 (only one principal wall portion 52 shown in FIG. 19) and a long side wall portion 55. Similarly to Embodiments 1 and 2, the second case 309 includes a second short side wall portion 354. The third case 310 includes a first short side wall portion 353, and is formed so as to be symmetrical to the second case 309. That is, each of the second case 309 and the third case 310 is configured to include a catch arm portion 91, and thus is guided by a guide (not shown) of the first case 308 to catch an engaging projection (not shown). In the second case 309 and the third case 310, the pressing portions 53*a* and 54*a* of Embodiment 1 are not provided.

In assembling the ultrasonic actuator 302 configured in the above-described manner, the actuator body 4 and the support unit 306 are first housed in the first case 308. In this sate, the second case 309 is attached to the first case 308 from one side in the longitudinal direction of the actuator body 4, and the third case 310 is attached to the first case 308 from the other side in the longitudinal direction of the actuator body 4. The second case 309 is attached to the first case 308 in the same manner as in Embodiment 1. The third case 310 is attached to the first case 308 in the same manner as in attaching the second case 309 except that the direction in which the second case 309 is attached is reversed about the center portion in the longitudinal direction. When the attaching of the second case 309 and the third case 310 to the first case 308 is performed, the first short side wall portion 353 of the third case 310 contacts on one of support rubbers 61, and the second short side wall portion 354 of the second case 309 contacts on the other one of the support rubbers 61, and then, they press the support rubbers 61 toward the actuator body 4. The one of the support rubbers 61 is compression-deformed between the first short side wall portion 353 and the actuator body 4, and the other one of the support rubbers 61 is compression-deformed between the second short side wall portion 354 and the actuator body 4. Thus, when this compression deformation of the support rubbers 61 occurs, an inner surface of the first short side wall portion 353 and an inner surface of the second short side wall portion 354 contact on the pressed portions 368 of the connection rubber 363, so that the long side portion 364 of the connection rubber 363 is pressed in the longitudinal direction of the long side portion 364. As a result, the long side portion 364 is hardly affected by a moment which causes both of the end portions of the long side portion 364 to be lifted up toward the actuator body 4, and is forcibly compression-deformed in the longitudinal direction of the long side portion 364 by compression force from the first short side wall portion 353 and the second short side wall portion 354.

According to Embodiment 3, the thin-walled portions 367 are formed to be curved with respect to the longitudinal direction of the center portion 364a and the end portions 364b, and thus, when compression force is applied in the longitudinal direction of the long side portion 364, the thin-walled portions 367 can be easily buckled, i.e., deformed. That is, the long side portion 364 can be easily compression-deformed by small force.

Furthermore, each of the thin-walled portions 367 is connected to a part of associated one of the center portion 364a and the end portions 364b located closer to the case 305 in the thickness direction of the center portion 364a and the end portions 364b, and are also curved toward the actuator body 4 in the thickness direction. Thus, when the long side portion 364 is compression-deformed, the thin-walled portions 367 are deformed toward the actuator body 4 in the thickness direction, and a dimension in the thickness direction of the long side portion 364 is effectively utilized in the deformation. Therefore, the amount of a portion of each of thin-walled portions 367 protruding outwardly from the long side portion 364 when the thin-walled portions 367 are deformed is small and the thin-walled portions 367 can be compactly compression-deformed. Therefore, the size of the support unit 306, and consequently, the size of the ultrasonic actuator 302 can be advantageously reduced.

Figure 21:
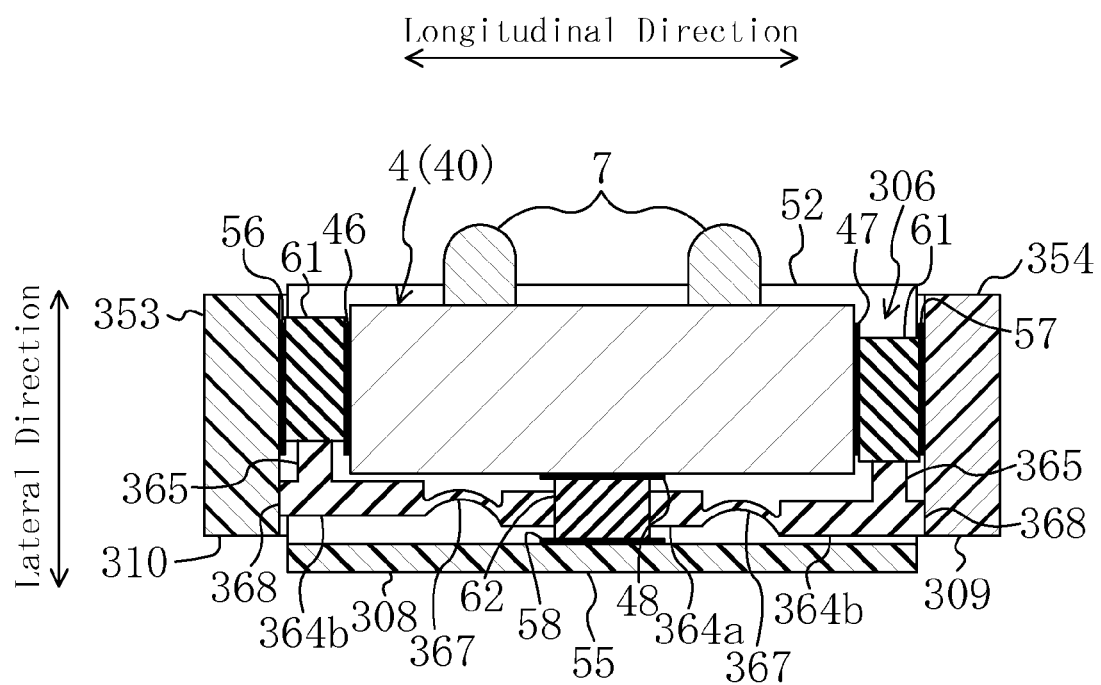
FIG. 21 is a cross-sectional view of the ultrasonic actuator when the position of a support rubber is shifted.

Furthermore, since each of the thin-walled portions 367 is flat in the lateral direction of the actuator body 4, thrust deformation in the lateral direction of the support unit 306 can be absorbed by the thin-walled portions 367. That is, as shown in FIG. 21, even when the position of each of the support rubbers 61 is slightly shifted in the lateral direction, the thin-walled portions 367 can be deformed to absorb the shift. Therefore, unnecessary external force and a moment are not applied to other parts of the connection rubber 363, i.e., the center portion 364a, the end portions 364b, and the short side portions 365, and consequently, unnecessary external force does not act on the support rubbers 61. As a result, compression force can be stably applied to the actuator body 4 from the support rubbers 61, and the support rubbers 61 can be held between the actuator body 4 and the case 305 with a constant compressibility, thus ensuring electrical conduction between the actuator body 4 and the case 305.

Figure 22:
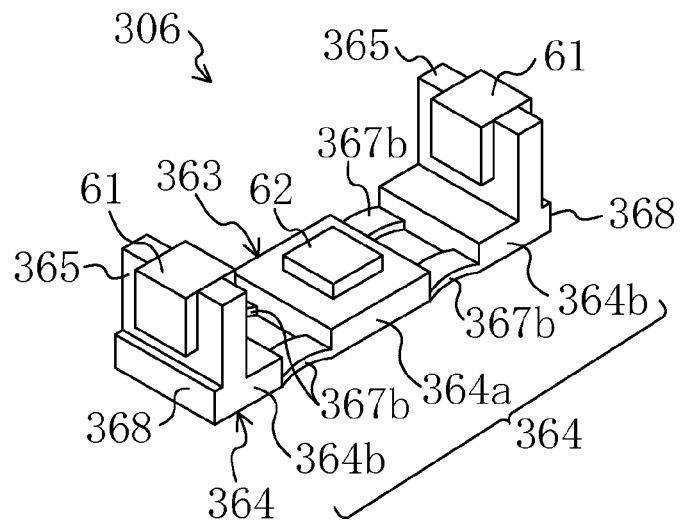
FIG. 22 is a perspective view of a support unit according to a modified example of Embodiment 3.

As shown in FIG. 22, a configuration including divided thin-walled portions 367b in the lateral direction of the long side portion 364 (the thickness direction of the actuator body 4) may be used. In this case, the plurality of the thin-walled portions 367b are provided in the thickness direction of the actuator body 4, so that and thus, positioning accuracy in positioning the support rubbers 61 in the thickness direction can be improved.

Embodiment 4

Next, an ultrasonic actuator 402 according to Embodiment 4 of the present invention will be described.

In the ultrasonic actuator 402 of Embodiment 4, an actuator body 404 and a support unit 406 have different shapes from those of the actuator body and the support unit of Embodiment 1 and the like. In the ultrasonic actuator 402, dummy members 79 as balance weights are provided to the actuator body 404 utilizing reduced-material portions of the support unit 406.

Specifically, as the height of the driver elements 7 from the setting surface 40a of the actuator body 4 increases, an elliptical motion of each of abutting portions, i.e., abutting areas of the driver elements 7 with the stage 11 becomes larger. As a result, the amount of displacement in the longitudinal direction of the actuator body 4 can be increased, so that the driving efficiency of the ultrasonic actuator can be improved.

Figure 23:
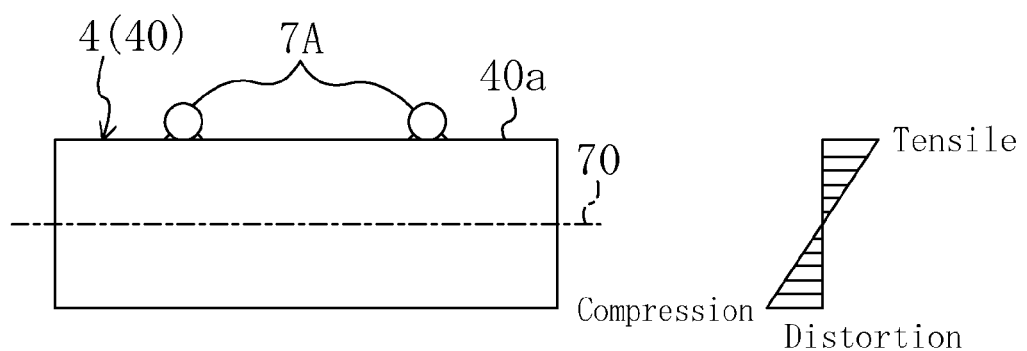
FIG. 23 is a front view of an actuator body on which relatively small driver elements are provided.

Meanwhile, the position of a natural plane of bending vibration becomes a problem. Specifically, as shown in FIG. 23 in bending vibration, distortion in the longitudinal direction of the actuator body 4 varies according to the position of the actuator body 4 in the lateral direction. The term "natural plane" used herein means a plane where this distortion is zero. For example, in a state in which the actuator body 4 is generating bending vibration, tensile distortion increases as a distance from the natural plane in the direction to the setting surface 40a increases, while compression distortion increases as a distance from the natural plane in the direction to a long side surface which is opposite to the setting surface 40a increases.

If the driver elements 7 are not provided, a natural plane of the bending vibration of the actuator body 4 is located at a center of the actuator body 4 in the lateral direction. When driver elements 7A are light in weight, as shown in FIG. 23, the driver elements 7A have only small influence on a natural plane 70, and thus, the natural plane 70 is still located substantially at the center of the actuator body 4 in the lateral direction. Therefore, tensile distortion and compression distortion respectively located in a part of the actuator body 4 located closer to the setting surface 40a and a part of the actuator body 4 located closer to the opposite surface to the setting surface 40a are point symmetrical across the natural plane 70, and distortion in the part of the actuator body 4 located closer to the setting surface 40a and distortion in the part of the actuator body 4 located closer to the opposite surface to the setting surface 40a are equal in quantity (scalar quantity) with opposite signs.

Figure 24:
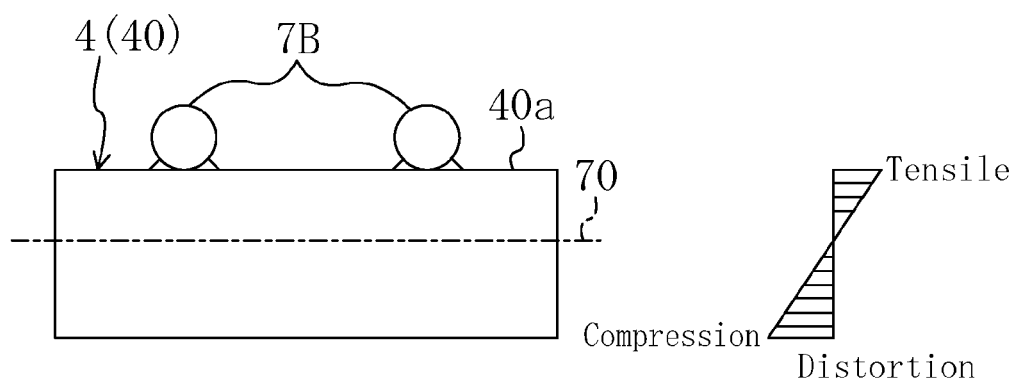
FIG. 24 is a front view of an actuator body on which relatively large driver elements are provided.

However, to increase the height of each of driver elements 7B from the setting surface 40a in order to increase the driving efficiency of the ultrasonic actuator, the size of the driver elements 7B is increased, and thus, the weight of the driver elements 7B is increased. As a result, as shown in FIG. 24, the natural plane 70 of bending vibration of the actuator body 4 is moved from the center of the actuator body 4 in the lateral direction toward the setting surface 40a. Therefore, the degree of distortion in the part of the actuator body 4 located closer to the setting surface 40a is smaller than the degree of distortion in the part of the actuator body 4 located closer to the opposite surface to the setting surface 40a. Thus, when the natural plane is moved to the part of the actuator body 4 closer to the setting surface 40a in the above-described manner, distortion of the actuator body 4 cannot be effectively utilized in an orbit motion of the driver elements 7B.

Figure 25:
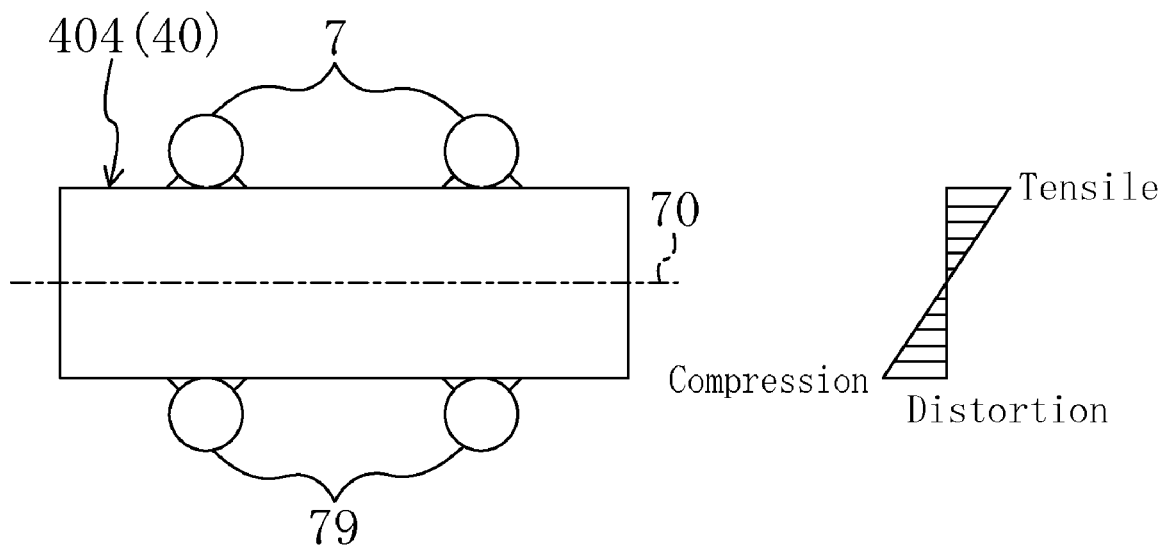
FIG. 25 is a front view of an actuator body according to Embodiment 4.

Therefore, as shown in FIG. 25, in the actuator body 404 of Embodiment 4, a dummy member 79 is provided at a line symmetrical position to each of the driver elements 7 with respect to a straight line passing a center portion of the actuator body 404 in the lateral direction and extending in the longitudinal direction. Each of the dummy members 79 is formed of the same material as that of the driver elements 7 and has the same shape as that of the driver elements 7. Thus, the natural plane of bending vibration of the actuator body 404 is located at a center of the actuator body 404 in the lateral direction. Accordingly, with the dummy members 79 provided, even when the height of each of the driver elements 7 from the setting surface 40a is increased, the natural plane of bending vibration of the actuator body 404 can be maintained to be at the center of the actuator body 404 in the lateral direction, so that the driving efficiency of the ultrasonic actuator 2 can be improved according to the height of the driver elements 7.

Figure 26:
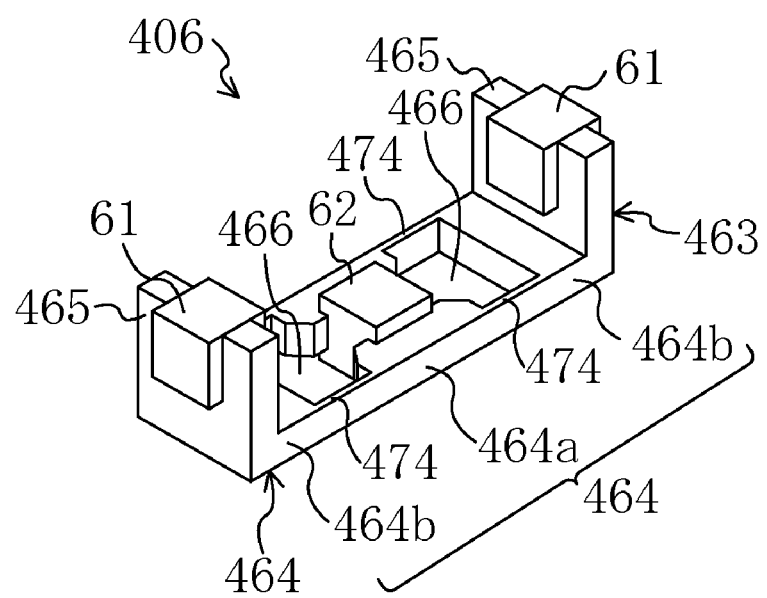
FIG. 26 is a perspective view of a support unit.
Figure 27:
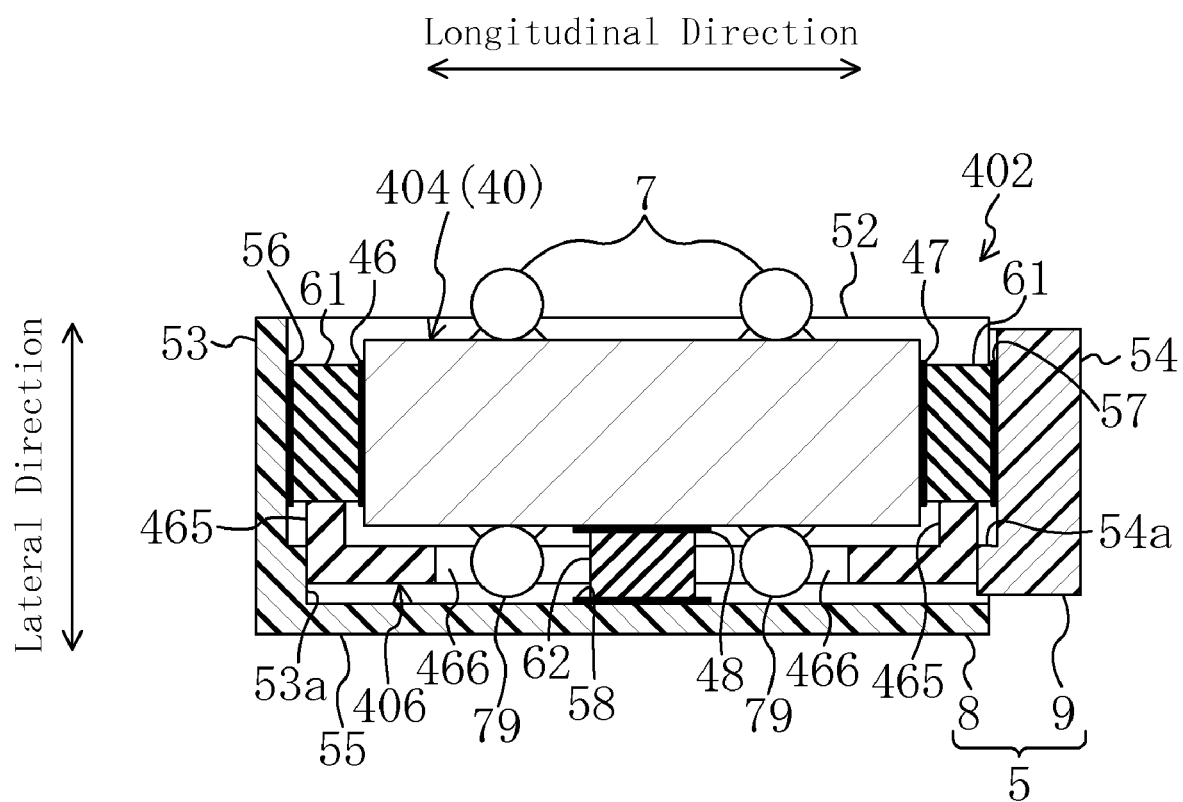
FIG. 27 is a cross-sectional view of an ultrasonic actuator.
Figure 28:
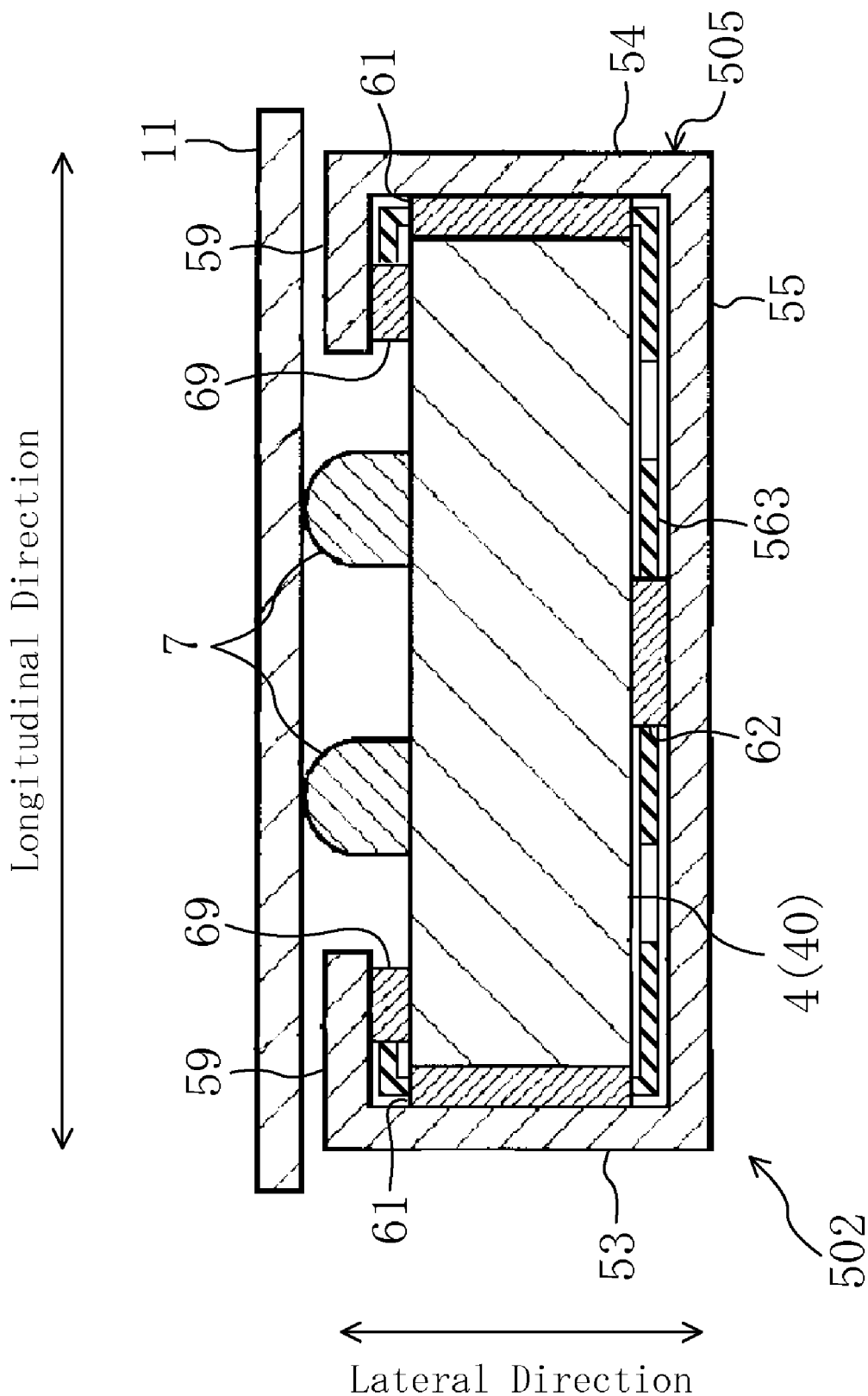
FIG. 28 is a cross-sectional view of an ultrasonic actuator according to Embodiment 5.

In this embodiment, as shown in FIG. 26, a connection rubber 463 of the support unit 406 includes a long side portion 464 including a center portion 464a in which the bias rubber 62 is inserted so as pass through the center portion 464a, end portions 464b on which short side portions 465 are provided so as to extend upright therefrom, and thin-walled portions 467 for connecting the center portion 464a with the end portions 464b. That is, in the long side portion 464, through holes 466 are formed in parts thereof in which the thin-walled portions 467 are provided, so as to pass through the long side portion 464 in the thickness direction. As shown in FIG. 27, the dummy members 79 of the actuator body 404 are configured to be located respectively in the through holes 466 of the connection rubber 463 when being housed in the case 5. Thus, the dummy members 79 are not in contact with the support unit 406, and therefore, disturbing of vibration of the actuator body 4 can be substantially prevented.

Similar advantages and effects to those of Embodiments 1-3 can be achieved by the configuration in which the thin-walled portions 467 are provided to the connection rubber 463.

Moreover, since each of the dummy members 79 has a spherical shape, the contact area of the dummy member 79 with a setting surface 40a of the actuator body 404 can be reduced. Thus, damping of longitudinal vibration and bending vibration of the actuator body 404 can be prevented.

Furthermore, a material such as zirconia, alumina or the like, which has excellent abrasion resistance, has to be used for the driver elements 7. In contrast, abrasion resistance does not have to be in consideration for the dummy members 79, and therefore, for example, a material such as lead alloy, tungsten alloy or the like, which has a large specific gravity, can be used for the dummy members 79. Thus, the size of the dummy members 79 can be reduced, so that the size of the ultrasonic actuator 402 can be reduced.

Embodiment 5

Next, an ultrasonic actuator 502 according to Embodiment 5 of the present invention will be described.

The ultrasonic actuator 502 of Embodiment 5 is different from the ultrasonic actuator of Embodiment 1 in which compression force is applied to the actuator body 4 in advance only in the vibration direction of longitudinal vibration of the actuator body 4, in that compression force is applied to the actuator body 4 in advance in the vibration directions of longitudinal vibration and bending vibration of the actuator body 4.

Specifically, at one side (i.e., an upper side of FIG. 2) of a case 505 in the lateral direction, overhang portions 59 are provided so as to extend inwardly in the longitudinal direction, respectively, from the first short side wall portion 53 and the second short side wall portion 54. That is, the overhang portions 59 are provided so as to face the long side wall portion 55.

When the actuator body 4 is housed in the case 505, each of pressurizing rubbers 69, which is compression-deformed in the lateral direction of the actuator body 4, is interposed between the actuator body 4 and an associated one of the overhang portions 59. The pressurizing rubbers 69 are provided respectively at ones of 10 antinodes of vibration of the actuator body 4 for generating the first-order mode of longitudinal vibration and the second order mode of bending vibration located at end portions of the setting surface 40a of the actuator body 4.

In this case, in the case 505, the bias rubber 62 is interposed between the actuator body 4 and the long side wall portion 55 and is compression-deformed, and thus, compression force is applied to the actuator body 4 in advance in the vibration direction of bending vibration by the bias rubber 62 and the pressurizing rubbers 69.

In the ultrasonic actuator 502 configured in the above-described manner, the driver elements 7 are placed so as to be pressed to the stage 11. That is, the ultrasonic actuator 502 is placed with the bias rubber 62 further compression-deformed. In other words, the bias rubber 62 biases the actuator body 4 to the stage 11, and applies, in cooperation with the pressurizing rubbers 69, compression force to the actuator body 4 in advance in the vibration direction of bending vibration.

Furthermore, similarly to Embodiment 1, compression force is applied to the actuator body 4 in advance by the support rubbers 61 also in the vibration direction of longitudinal vibration.

That is, the support rubbers 61, the bias rubber 62, and the pressurizing rubbers 69 form pressurizing members.

The support rubbers 61, the bias rubber 62, and the pressurizing rubbers 69 are connected to one another by a connection rubber 563. Similarly to each of Embodiments 1-4, thin-walled portions are formed in the connection rubber 563.

Although not shown in the drawings, the case 505 has a separate configuration of a first case and a second case (and a third case depending on the case), and is configured so that the support rubbers 61, the bias rubber 62, the pressurizing rubbers 69, and the connection rubber 563 are compression-deformed when the case 505 is assembled.

The bias rubber 62 is located at a center portion of the actuator body 4 in the longitudinal direction. The pressurizing rubbers 69 are provided on parts of the actuator body 4 located at the same distance from the center portion of the actuator body 4 in the longitudinal direction toward both of end portions of the actuator body 4. Thus, compression force to act on the actuator body 4 in the vibration direction of bending vibration acts line symmetrically with respect to the center portion in the longitudinal direction of the actuator body 4. Furthermore, to maintain symmetry property of the longitudinal vibration and bending vibration, compression force is preferably applied symmetrically in the thickness direction of the actuator body 4.

In terms of improving reliability, it is more effective to apply larger compression force to the actuator body 4 in advance by the bias rubber 62 and the pressurizing rubbers 69. However, when compression force is too large, bending vibration is disturbed. Therefore, it is preferable to apply compression force corresponding to one to ten times of pressing force of the actuator body 4 to the stage 11. In the case of the ultrasonic actuator having a length of about several mm, pressing force is normally about 0.1 N to 10 N, and therefore, force applied to the entire actuator body 4 by application of compression force may be about 0.1 N to 100 N. Normally, when the volume of the actuator body 4 is increased, pressing force is also increased according to the volume.

In Embodiment 5, although not shown in the drawings, five external electrodes which are conductive respectively to the first electrodes 42a and 42b, the second electrodes 43a and 43b, and the common electrode layer 44 are provided on side surfaces of the actuator body 4, and case side electrodes are provided in parts of the case 505 facing the five external electrodes, respectively. Similarly to the support rubbers 61 and the bias rubber 62, the pressurizing rubbers 69 are formed of conductive rubber including an insulating layer 6a and a conductive layer 6b stacked, and electrical conduction of the five external electrodes of the actuator body with the five case side electrodes of the case 505 are provided by the support rubbers 61, the bias rubber 62 and the pressurizing rubbers 69. Moreover, the five case side electrodes are in electrical conduction respectively with the five terminal electrodes provided on external surfaces of the case 505, and thus, a voltage can be applied to each of the first electrodes 42a and 42b, the second electrodes 43a and 43b, and the common electrode layer 44 provided to the actuator body 4 by supplying power to the terminal electrodes.

Thus, according to Embodiment 5, by applying compression force to antinodes of vibration of the actuator body 4 in advance by the support rubbers 61, the bias rubber 62, and the pressurizing rubbers 69, distortion due to tensile stress generated along with vibration of the actuator body 4 hardly exceed the elastic limit of the actuator body 4, more specifically, the piezoelectric element layers 41, so that damage of the actuator body 4 can be prevented. As a result, reliability of the ultrasonic actuator 502 can be improved.

Moreover, the actuator body 4 can be supported without damping vibration of the actuator body 4 by supporting the actuator body 4 with respect to the case 505 by the support rubbers 61, the bias rubber 62, and the pressurizing rubbers 69 which are elastic bodies. As a result, the efficiency of the ultrasonic actuator 502 can be improved.

Furthermore, the support rubbers 61, the bias rubber 62, and the pressurizing rubbers 69 are formed of conductive rubber, and electrical conduction of the external electrodes of the actuator body 4 respectively with the electrodes of the case 505 is provided by the support rubbers 61. Therefore, cases where stress concentrates at parts of the actuator body 4 at which solder is provided to cause breaking of the actuator body 4 can be avoided.

In addition, similar advantages and effects to those of Embodiment 1 can be achieved.

The bias rubber 62 is placed in the center portion of the actuator body 4 in the longitudinal direction. However, similarly to the pressurizing rubbers 69, the bias rubber 62 may be placed at an antinode of bending vibration at each of end portions of the actuator body 4 in the longitudinal direction.

As another effect of Embodiment 5, the effect of stabilizing operation property of the ultrasonic actuator 502 can be achieved.

More specifically, the ultrasonic actuator 502 causes the actuator body 4 to induce longitudinal vibration and bending vibration in a cooperated manner, thereby causing each of the driver elements 7 to generate an elliptical motion. Properties of the ultrasonic actuator 502 differ depending on the relationship between the resonance frequency of longitudinal vibration and the resonance frequency of bending vibration, and thus, is greatly changed when the relationship between the resonance frequency of bending vibration and the resonance frequency of longitudinal vibration is shifted from a designed value.

In the configuration of this embodiment in which the ultrasonic actuator 502 is pressed to the stage 11, particularly, in the case of bending vibration, the vibration direction is the same as the direction in which the ultrasonic actuator 502 is pressed to the stage 11. Thus, reaction force of actual pressing force applied to the ultrasonic actuator 2 acts on the actuator body 4 via the driver elements 7, thereby causing the resonance frequency to be easily changed. In the case where constant pressing force is externally applied to the ultrasonic actuator 502, the position of the stage 11 is changed or a contact state of each of the driver elements 7 with the stage 11 is changed when the stage 11 is driven by the ultrasonic actuator 502. Thus, pressing force practically applied to the ultrasonic actuator 502 is changed, i.e., reaction force acting on the actuator body 4 is changed, so that the resonance frequency of banding vibration is changed. Conventionally, this results in a problem in which the relationship between the resonance frequencies of longitudinal vibration and bending vibration is changed, and thus the properties of the ultrasonic actuator 502 become unstable.

Therefore, in the ultrasonic actuator 502, compression force is applied particularly to antinodes of bending vibration in advance. By causing compression force to act on the actuator body 4 in advance in this manner, influences of change in reactive force from the stage 11 on the resonance frequency of bending vibration of the actuator body 4 is reduced, compared to the configuration in which compression force is not caused to act in advance, so that stable properties of the ultrasonic actuator 502 can be achieved. Accordingly, force applied to the entire actuator body 4 by application of compression force in advance is preferably larger than pressing force of the ultrasonic actuator 502. Thus, influences of reaction force to act on the actuator body 4 on the resonance frequency of the actuator body 4 can be relatively reduced.

Other Embodiments

According to the present invention, in connection with the above-described embodiments, an ultrasonic actuator may have the following configuration.

Specifically, low stiffness portions in the connection rubber 63 (263, 363 or 463) are formed of the thin-walled portions 67 (267, 367 or 467), but are not limited thereto. That is, as long as a lower stiffness than that of the center portion 64a (264a, 364a and 464a) and the like can be achieved, any shape can be employed. Moreover, the thin-walled portions 67 (267, 367 or 467) do not necessarily have to be provided at both sides of the bias rubber 62 in the longitudinal direction so that the bias rubber 62 is interposed between the thin-walled portions 67.

As the configuration in which the long side portion of the connection rubber 63 (263, 363 or 463) is compression-deformed by the case 5 (205, 305 or 405), in addition to the configuration in which the pressing portion provided on the case is formed to protrude, and the configuration in which the pressed portion provided on the long side portion is formed to protrude, which have been described in the above-described embodiments, any configuration can be employed. For example, both of the pressing portion provided on the case and the pressed portion provided on the long side portion may be configured to protrude.

The shape of the connection rubber 63 (263, 363, 463 or 563) is not limited to a square U-shape which has been described in the above-described embodiments. As long as the connection rubber 63 (263, 363, 463 or 563) is configured to connect the support rubbers 61 (the bias rubber 62 and the pressurizing rubbers 69 depending on the embodiments), any configuration may be employed.

Combination of the support unit, the pressing portions, the pressed portions, the case, and the like in each of the embodiments is not limited the combinations shown in the above-described embodiments. The support unit, the pressing portions, the pressed portions, the case, and the like in each of the embodiments may be arbitrarily combined.

Only antinodes of vibration have been described as portions of the actuator body 4 to which compression force is applied. However, some of elastic bodies may support at portions of the actuator body 4 in a wide range including the antinodes of vibration to apply compression force thereto.

The support rubbers 61 and the bias rubber 62 do not have to be formed of conductive rubber. That is, a configuration in which the support rubbers 61 and the bias rubber 62 are formed of insulating rubber and power supply lines are connected to the actuator body 4 by soldering or the like may be used.

The ultrasonic actuator 2 is configured so as to cause the actuator body 4 to generate the first-order mode of longitudinal vibration along the longitudinal direction and the second-order mode of bending vibration in a cooperated manner, but is not limited to such a configuration. The ultrasonic actuator 2 may have a configuration in which some other type of vibration or mode is induced. As long as a vibratory actuator is configured so that the actuator body 4 is vibrated to output driving force through friction force between each of the driver elements 7 and the stage 11, any configuration can be employed.

Furthermore, an ultrasonic actuator in which a driver element is provided on one of short side surfaces of the actuator body 4 may be employed. Even in such a configuration, the actuator body 4 generates composite vibration of the first-order mode of longitudinal vibration along the longitudinal direction and the second-order mode of bending vibration to cause each driver element to make an orbit motion, so that the stage can be moved in a predetermined movable direction (a parallel direction to the lateral direction) through friction force with the stage.

Each of the actuator bodies 4 and 404 is formed of the piezoelectric element unit 40. However, each of the actuator bodies 4 and 404 may have a configuration in which a piezoelectric element is attached to a substrate of metal or the like or a configuration in which an oscillator is formed of metal or the like and a piezoelectric element is inserted therein. In such a configuration, an oscillator including a piezoelectric element forms an actuator body.

Figure 29:
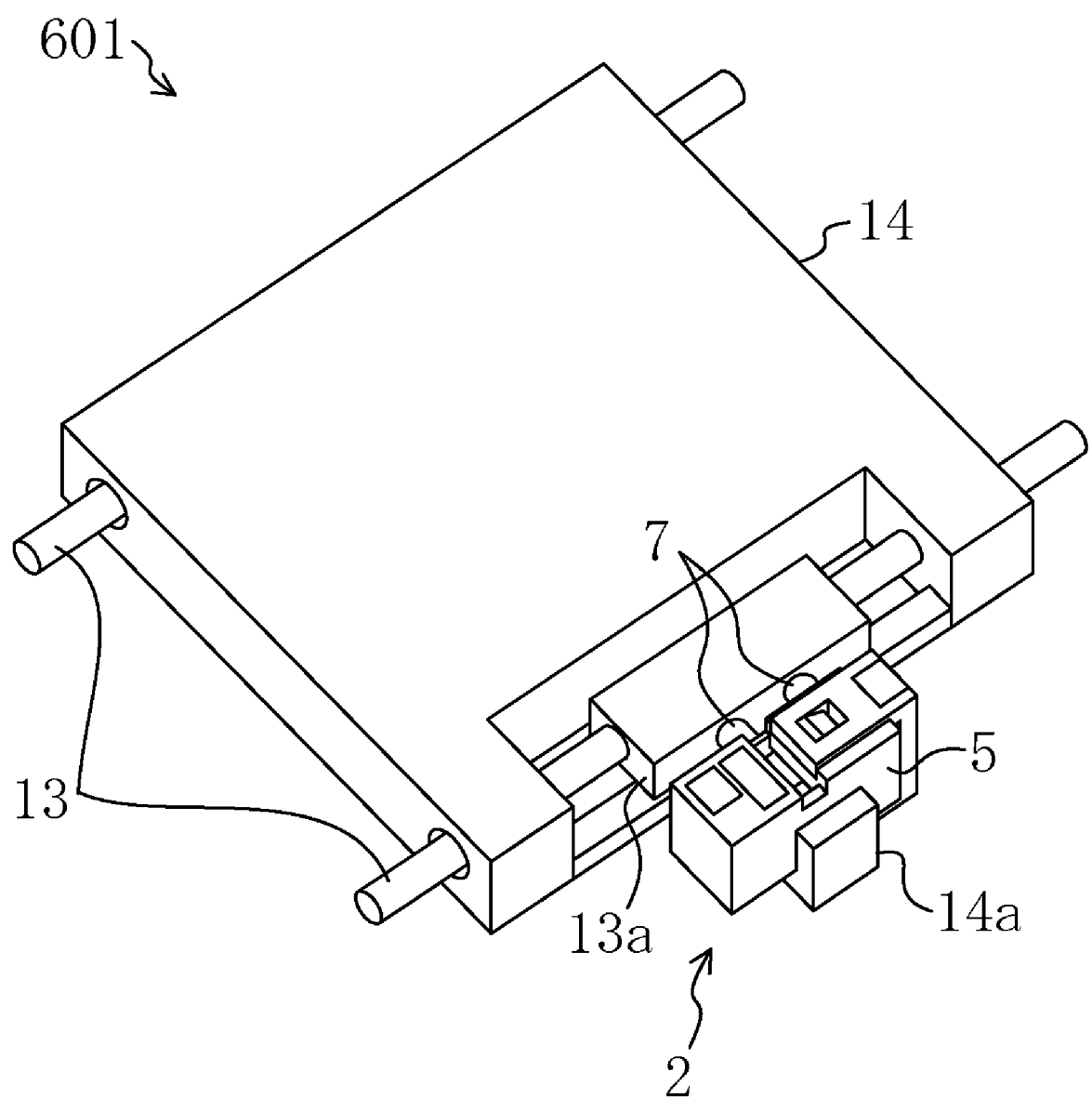
FIG. 29 is a perspective view of a drive unit according to another embodiment.

Furthermore, in the above-described embodiments, the ultrasonic actuator 2 is fixed to the base and the driver elements 7 are provided to abut on the movable stage 11 to operate the ultrasonic actuator 2, thereby driving the stage 11. However, as shown in FIG. 29, a configuration in which the ultrasonic actuator 2 is fixed to a stage may be employed. Specifically, a drive unit 601 includes guides 13 fixed to a base in parallel to one another, a stage 14 attached to the guides 13 so as to be capable of sliding, and the ultrasonic actuator 2. On one of the guides 13, an abutment member 13a is provided so as to be fixed to the guide 13. An actuator attaching portion 14a is provided on the stage 14. Moreover, the ultrasonic actuator 2 is configured so that the driver elements 7 abut on the abutment member 13a of the guide 13 and the case 5 is attached to the actuator attaching portion 14a of the stage 14. In this state, when the ultrasonic actuator 2 is operated, the driver elements 7 output driving force to the abutment member 13a. Since the abutment member 13a is fixed, the ultrasonic actuator 2 itself is vibrated along the longitudinal direction of the guides 13 relatively to the abutment member 13a. As a result, the stage 14 connected to the case 5 via the actuator attaching portion 14a is driven in the longitudinal direction of the guides 13.

Figure 30:
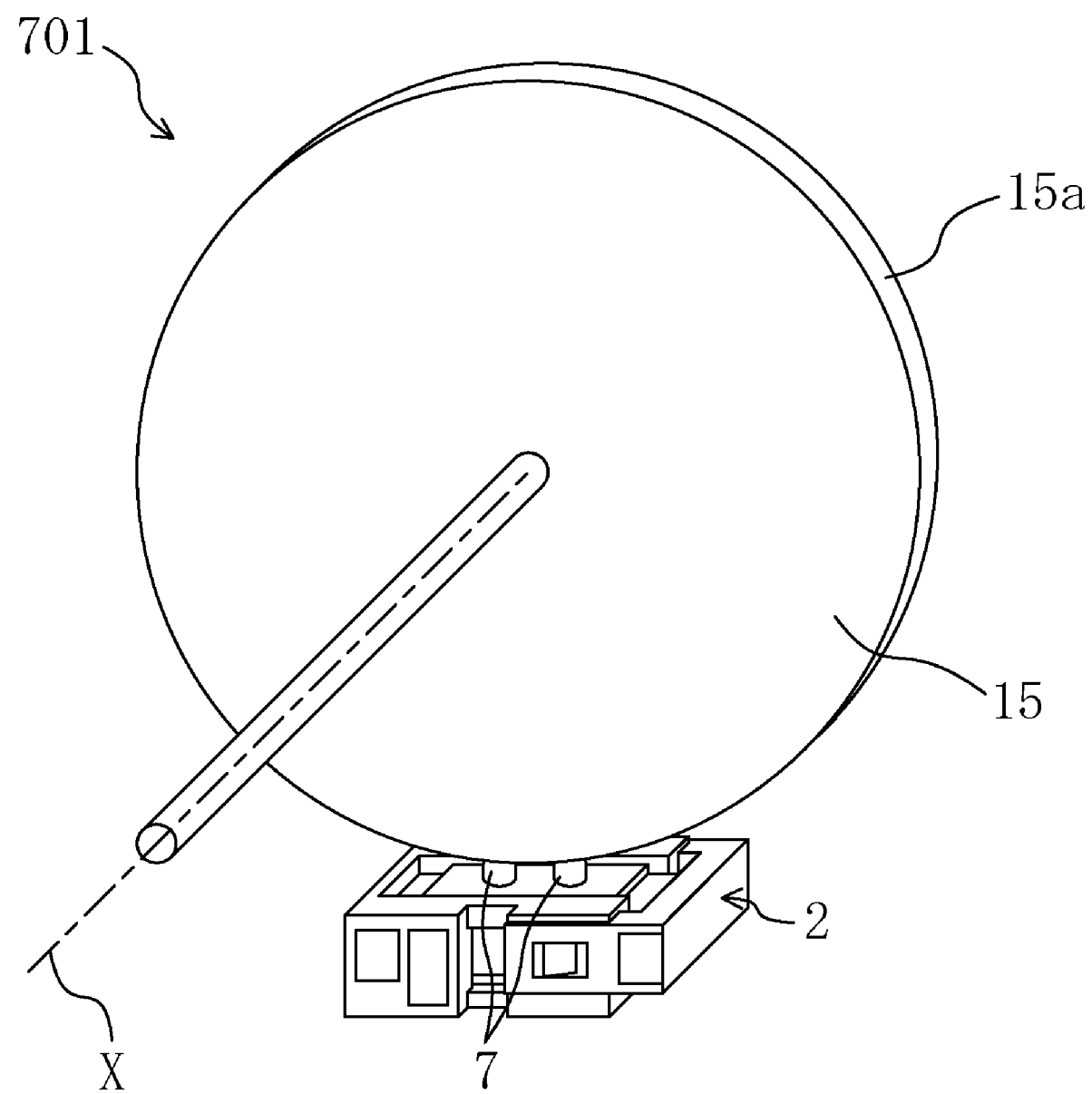
FIG. 30 is a perspective view of a drive unit according to still another embodiment.
Figure 31:
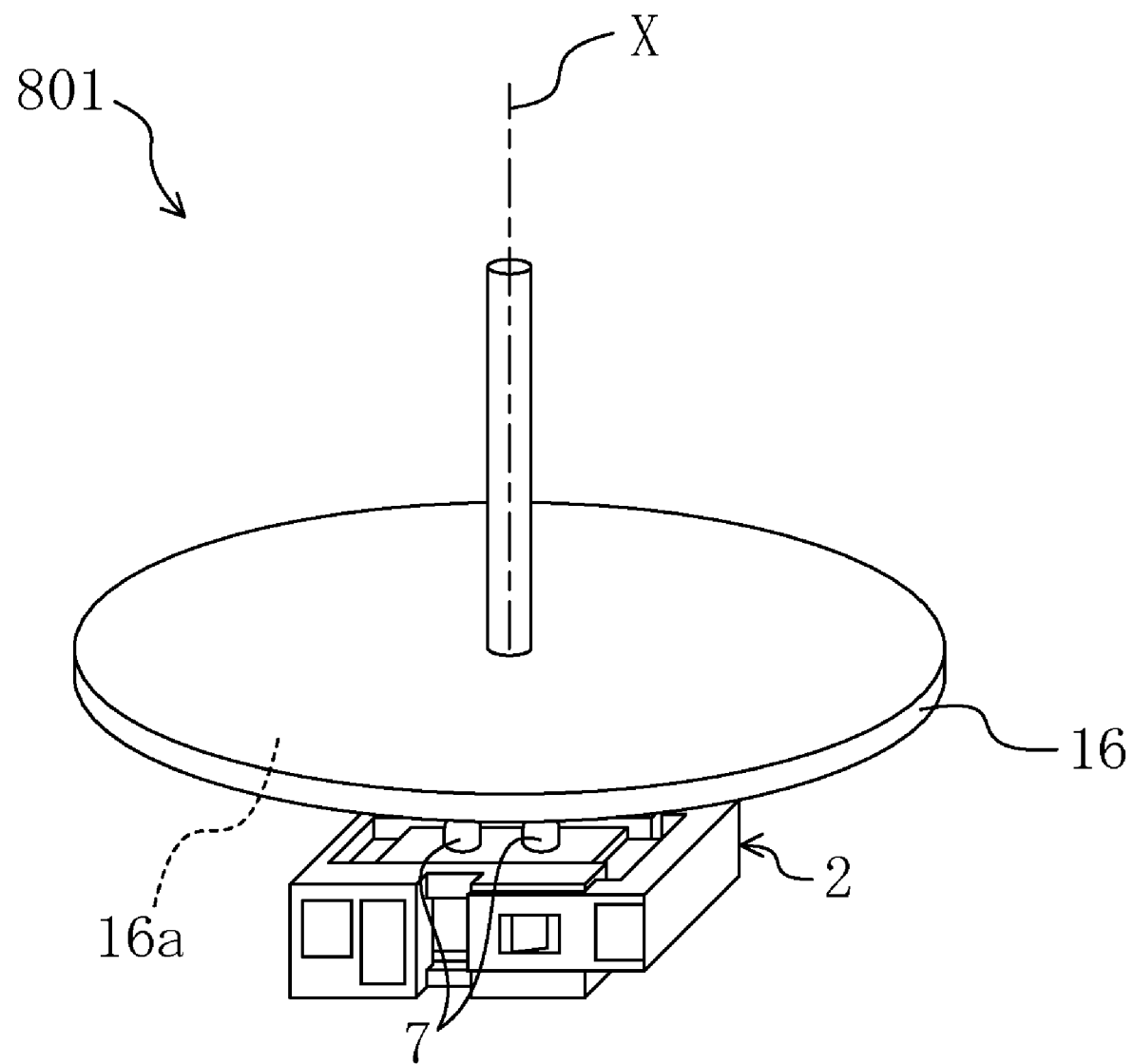
FIG. 31 is a perspective view of a drive unit according to yet another embodiment.

In the above-described embodiments, the stage 11 driven by giving driving force of the ultrasonic actuator thereto has a flat plate shape. However, the shape of the stage is not limited thereto, but any configuration may be employed as a configuration of a movable body. For example, as shown in FIG. 30, a drive unit 701 in which a circular plate body 15 capable of spinning about a predetermined axis X is a movable body and driver elements 7 of an ultrasonic actuator are configured to abut on a circumferential surface 15a of the circular plate body 15 may be employed. In such a configuration, when the ultrasonic actuator is driven, the circular plate body 15 is caused to spin around the predetermined axis X due to an approximate elliptical motion of the driver elements 7. Also, as shown in FIG. 31, a drive unit 801 in which a circular plate body 16 capable of spinning about a predetermined axis X is a movable body and driver elements 7 of an ultrasonic actuator are configured to abut on a planar portion 16a of the circular plate body 16 may be employed. In such a configuration, when the ultrasonic actuator is driven, the circular plate body 16 is driven due to an approximate elliptical motion of the driver elements 7, in a direction along a tangential direction of the circular plate body 16 at its portion on which each driver element 7 abuts, and, as a result, the circular plate body 16 spins about the predetermined axis X.

Note that the above-described embodiments are essentially preferable examples which are illustrative and do not limit the present invention, its applications and the scope of use of the invention.

INDUSTRIAL APPLICABILITY

As described above, the present invention is useful for a vibratory actuator including a piezoelectric element, and a drive unit including the vibratory actuator.

The invention claimed is:

1. A vibratory actuator, comprising:
an actuator body, including a piezoelectric element, for outputting driving power by generating a plurality of vibrations having different vibration directions;
a case for housing the actuator body; and
a pressurizing unit including at least two pressurizing members, provided between the case and the actuator body, for applying compression force to the actuator body in advance at non-node portions of vibration of the actuator body from both sides in a vibration direction of the vibration, and a connection member for connecting the at least two pressurizing members with one another,
wherein
the connection member includes a body portion and a low stiffness portion having a lower stiffness than that of the body portion, and
the pressurizing unit has larger outer dimensions than corresponding inner dimensions of the case, and at least the connection member is compression-deformed at the low stiffness portion when the pressurizing unit is provided between the case and the actuator body.

2. The vibratory actuator of claim 1, wherein
the low stiffness portion has a smaller cross-section area than that of the body portion.

3. The vibratory actuator of claim 2, wherein
the low stiffness portion is curved with respect to the longitudinal direction of the body portion.

4. The vibratory actuator of claim 1, wherein
a body side power supply electrode for applying a voltage to the piezoelectric element is provided to the actuator body, a case side power supply electrode for supplying power to the actuator body is provided to the case, and each of the pressurizing members is formed of conductive rubber to provide electrical conduction of the body side power supply electrode with the case side power supply electrode.

5. The vibratory actuator of claim 1, wherein the case has a separate configuration of a first case and a second case, and the second case is attached to the first case along a direction of compression force.

6. The vibratory actuator of claim 5, wherein a pressing portion for causing the connection member to be compression-deformed in parallel to the vibration direction is provided to each of the first and second cases, and a pressed portion for abutting on the pressing portion of an associated one of the first and second cases is provided to the connection member.

7. The vibratory actuator of claim 1, further comprising:

a driver element, provided to the actuator body, for outputting driving force by operating with the vibrations of the actuator body; and a balance weight provided on an opposite side of the actuator body to a side thereof on which the driver element is provided, wherein the connection member extends between a surface of the actuator body on which the balance weight is provided and the case to connect the pressurizing members with one another and has at least an opening facing toward the actuator body to form the low stiffness portion, and the actuator body is placed so that the balance weight is located in the opening in the connection member.

8. A vibratory actuator comprising:

an actuator body, including a piezoelectric element, for outputting driving power by generating a plurality of vibrations having different vibration directions;

a case for housing the actuator body; and a pressurizing unit including at least two pressurizing members, provided between the case and the actuator body, for applying compression force to the actuator body in advance at non-node portions of vibration of the actuator body from both sides in a vibration direction of the vibration, and a connection member for connecting the at least two pressurizing members with one another, wherein a pressing portion for causing the connection member to be compression-deformed in parallel to the vibration direction is provided to the case, and a pressed portion for abutting on the pressing portion is provided to the connection member.

9. The vibratory actuator of claim 8, wherein the case has a separate configuration of a first case and a second case, the pressing portion is provided to each of the first and second cases, and the second case is attached to the first case along a direction of the compression force.

10. The vibratory actuator of claim 1, wherein the pressurizing members are provided at parts of the actuator body corresponding to antinodes of the vibration.

11. The vibratory actuator of claim 1, wherein the actuator body generates a second-order mode of bending vibration and a first-order mode of longitudinal vibration.

12. The vibratory actuator of claim 1, wherein the actuator body is configured so that the actuator body generates first vibration and second vibration having different vibration directions and a resonance frequency of the first vibration and a resonance frequency of the second vibration are matched to one another by compression force of the pressurizing members.

13. The vibratory actuator of claim 1, wherein the actuator body is configured so that the actuator body generates first vibration and second vibration having different vibration directions and a resonance frequency of the second vibration is caused to be higher than a resonance frequency of the first vibration by compression force of the pressurizing members.

14. A drive unit comprising:

a fixed body and a movable body capable of relative displacement; and the vibratory actuator of claim 1, provided between the fixed body and the movable body, wherein the vibratory actuator is placed so that the actuator body is pressed to the movable body, and compression force applied by the pressurizing members is larger than pressing force pressing the actuator body to the movable body.

15. The vibratory actuator of claim 8, wherein the pressurizing members are provided at parts of the actuator body corresponding to antinodes of the vibration.

16. The vibratory actuator of claim 8, wherein the actuator body generates a second-order mode of bending vibration and a first-order mode of longitudinal vibration.

17. The vibratory actuator of claim 8, wherein the actuator body is configured so that the actuator body generates first vibration and second vibration having different vibration directions and a resonance frequency of the first vibration and a resonance frequency of the second vibration are matched to one another by compression force of the pressurizing members.

18. The vibratory actuator of claim 8, wherein the actuator body is configured so that the actuator body generates first vibration and second vibration having different vibration directions and a resonance frequency of the second vibration is caused to be higher than a resonance frequency of the first vibration by compression force of the pressurizing members.

19. A drive unit comprising:

a fixed body and a movable body capable of relative displacement; and the vibratory actuator of claim 8, provided between the fixed body and the movable body, wherein the vibratory actuator is placed so that the actuator body is pressed to the movable body, and compression force applied by the pressurizing members is larger than pressing force pressing the actuator body to the movable body.

* * * * *